(12) United States Patent
Campbell

(10) Patent No.: US 7,153,721 B2
(45) Date of Patent: Dec. 26, 2006

(54) RESISTANCE VARIABLE MEMORY ELEMENTS BASED ON POLARIZED SILVER-SELENIDE NETWORK GROWTH

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/765,393

(22) Filed: Jan. 28, 2004

(65) Prior Publication Data

US 2005/0162907 A1    Jul. 28, 2005

(51) Int. Cl.
*H01L 21/00* (2006.01)
*H01L 21/06* (2006.01)

(52) U.S. Cl. .................. 438/95; 438/102; 257/E21.209
(58) Field of Classification Search .................. 438/95, 438/102, 103
See application file for complete search history.

(56) References Cited

U.S. PATENT DOCUMENTS

| | | | |
|---|---|---|---|
| 3,271,591 A | 9/1966 | Ovshinsky | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |

(Continued)

*Primary Examiner*—Michael Lebentritt
*Assistant Examiner*—Cheung Lee
(74) *Attorney, Agent, or Firm*—Dickstein Shapiro LLP

(57) ABSTRACT

The invention relates to a resistance variable memory element including polarizable metal-chalcogen regions within a doped chalcogenide glass. A method for physically aligning the polarizable metal-chalcogen regions to form a conducting channel is provided. The invention also relates to a resistance variable memory element including metal-chalcogen regions within a chalcogenide glass backbone. The metal-chalcogen regions and glass regions bond to form a conducting channel. In addition, a method of operating such memory elements is provided in which metal ions move in and out of the conducting channels in response to applied voltages, thereby affecting the resistance of the memory elements.

46 Claims, 13 Drawing Sheets

U.S. PATENT DOCUMENTS

| | | | |
|---|---|---|---|
| 5,296,716 | A | 3/1994 | Ovshinsky et al. |
| 5,335,219 | A | 8/1994 | Ovshinsky et al. |
| 5,341,328 | A | 8/1994 | Ovshinsky et al. |
| 5,359,205 | A | 10/1994 | Ovshinsky |
| 5,406,509 | A | 4/1995 | Ovshinsky et al. |
| 5,414,271 | A | 5/1995 | Ovshinsky et al. |
| 5,534,711 | A | 7/1996 | Ovshinsky et al. |
| 5,534,712 | A | 7/1996 | Ovshinsky et al. |
| 5,536,947 | A | 7/1996 | Klersy et al. |
| 5,543,737 | A | 8/1996 | Ovshinsky |
| 5,591,501 | A | 1/1997 | Ovshinsky et al. |
| 5,596,522 | A | 1/1997 | Ovshinsky et al. |
| 5,687,112 | A | 11/1997 | Ovshinsky |
| 5,694,054 | A | 12/1997 | Ovshinsky et al. |
| 5,714,768 | A | 2/1998 | Ovshinsky et al. |
| 5,825,046 | A | 10/1998 | Czubatyj et al. |
| 5,912,839 | A | 6/1999 | Ovshinsky et al. |
| 5,933,365 | A | 8/1999 | Klersy et al. |
| 6,011,757 | A | 1/2000 | Ovshinsky |
| 6,084,796 | A * | 7/2000 | Kozicki et al. ............ 365/153 |
| 6,087,674 | A | 7/2000 | Ovshinsky et al. |
| 6,141,241 | A | 10/2000 | Ovshinsky et al. |
| 6,339,544 | B1 | 1/2002 | Chiang et al. |
| 6,404,665 | B1 | 6/2002 | Lowery et al. |
| 6,429,064 | B1 | 8/2002 | Wicker |
| 6,437,383 | B1 | 8/2002 | Xu |
| 6,462,984 | B1 | 10/2002 | Xu et al. |
| 6,480,438 | B1 | 11/2002 | Park |
| 6,487,113 | B1 | 11/2002 | Park et al. |
| 6,501,111 | B1 | 12/2002 | Lowery |
| 6,507,061 | B1 | 1/2003 | Hudgens et al. |
| 6,511,862 | B1 | 1/2003 | Hudgens et al. |
| 6,511,867 | B1 | 1/2003 | Lowery et al. |
| 6,512,241 | B1 | 1/2003 | Lai |
| 6,514,805 | B1 | 2/2003 | Xu et al. |
| 6,531,373 | B1 | 3/2003 | Gill et al. |
| 6,534,781 | B1 | 3/2003 | Dennison |
| 6,545,287 | B1 | 4/2003 | Chiang |
| 6,545,907 | B1 | 4/2003 | Lowery et al. |
| 6,555,860 | B1 | 4/2003 | Lowery et al. |
| 6,563,164 | B1 | 5/2003 | Lowery et al. |
| 6,566,700 | B1 | 5/2003 | Xu |
| 6,567,293 | B1 | 5/2003 | Lowery et al. |
| 6,569,705 | B1 | 5/2003 | Chiang et al. |
| 6,570,784 | B1 | 5/2003 | Lowery |
| 6,576,921 | B1 | 6/2003 | Lowery |
| 6,586,761 | B1 | 7/2003 | Lowrey |
| 6,589,714 | B1 | 7/2003 | Maimon et al. |
| 6,590,807 | B1 | 7/2003 | Lowery |
| 6,593,176 | B1 | 7/2003 | Dennison |
| 6,597,009 | B1 | 7/2003 | Wicker |
| 6,605,527 | B1 | 8/2003 | Dennison et al. |
| 6,613,604 | B1 | 9/2003 | Maimon et al. |
| 6,621,095 | B1 | 9/2003 | Chiang et al. |
| 6,625,054 | B1 | 9/2003 | Lowery et al. |
| 6,642,102 | B1 | 11/2003 | Xu |
| 6,646,297 | B1 | 11/2003 | Dennison |
| 6,649,928 | B1 | 11/2003 | Dennison |
| 6,667,900 | B1 | 12/2003 | Lowery et al. |
| 6,671,710 | B1 | 12/2003 | Ovshinsky et al. |
| 6,673,648 | B1 | 1/2004 | Lowery |
| 6,673,700 | B1 | 1/2004 | Dennison et al. |
| 6,674,115 | B1 | 1/2004 | Hudgens et al. |
| 6,687,153 | B1 | 2/2004 | Lowery |
| 6,687,427 | B1 | 2/2004 | Ramalingam et al. |
| 6,690,026 | B1 | 2/2004 | Peterson |
| 6,696,355 | B1 | 2/2004 | Dennison |
| 6,707,712 | B1 | 3/2004 | Lowery |
| 6,714,954 | B1 | 3/2004 | Ovshinsky et al. |
| 2003/0048744 | A1 | 3/2003 | Ovshinsky et al. |
| 2003/0137869 | A1* | 7/2003 | Kozicki ................. 365/158 |
| 2003/0212724 | A1 | 11/2003 | Ovshinsky et al. |
| 2003/0212725 | A1 | 11/2003 | Ovshinsky et al. |
| 2004/0035401 | A1 | 2/2004 | Ramachandran et al. |
| 2004/0042259 | A1* | 3/2004 | Campbell et al. .......... 365/158 |

* cited by examiner (PRIOR TO 'CONDITIONING' OR 'WRITE' PULSE)

(AFTER 'CONDITIONING')

(AFTER 'WRITE')

(READ-OUT VOLTAGE)

(AFTER 'ERASE')

RESISTANCE VARIABLE MEMORY ELEMENTS BASED ON POLARIZED SILVER-SELENIDE NETWORK GROWTH

FIELD OF THE INVENTION

The invention relates to the field of random access memory (RAM) devices formed using a chalcogenide-based resistance variable memory element.

BACKGROUND OF THE INVENTION

A well-known semiconductor memory component is a random access memory (RAM). RAM permits repeated read and write operations on memory elements. Typically, RAM memory elements are volatile, in that stored data is lost once the power source is disconnected or removed. Non-limiting examples of RAM devices which contain such memory elements include dynamic random access memory (DRAM), synchronized dynamic random access memory (SDRAM) and static random access memory (SRAM). DRAM's and SDRAM's typically store data in capacitors which require periodic refreshing to maintain the stored data.

Recently, resistance variable memory elements have been investigated for suitability as semi-volatile and non-volatile random access memory elements. A class of such devices include an insulating material formed of a chalcogenide glass disposed between two electrodes. A conductive material is incorporated into the material. The resistance of the material can be changed between high and low resistance states by application of suitable voltages across the memory element. D. D. Thornburg has discussed polarization of arsenic triselenide in an electric field. For instance, the polarization of arsenic triselenide allows the memory device to switch between different memory states. See Thornburg, D. D., *Memory Switching in Amorphous Arsenic Triselenide*, J. NON-CRYST. SOLIDS 11 (1972), at 113–120; Thornburg, D. D. and White, R. M., *Electric Field Enhanced Phase Separation and Memory Switching in Amorphous Arsenic Triselenide*, J. APPL. PHYS. (1972), at 4609–4612.

When set in a particular resistance state, the particular resistance state of the memory element will remain intact for minutes, hours, or longer even after the voltage potentials are removed. Such a device can function, for example, as a semi or non-volatile resistance variable memory element having two resistance states, which in turn can define two logic states.

BRIEF SUMMARY OF THE INVENTION

In one aspect, exemplary embodiments of the invention provide a resistance variable memory element and a method of forming the same in which a doped chalcogenide glass contains regions of polarizable metal-chalcogen material forming a conducting channel present within a chalcogenide glass backbone. The conducting channel can receive and expel metal ions in and out of it to set a particular resistance state for the memory element in response to write and erase voltages.

In another aspect, exemplary embodiments of the invention provide a resistance variable memory element and a method of forming the same in which the resistance variable memory element comprises at least one chalcogenide glass layer and at least one metal-containing layer formed between two electrodes. The chalcogenide glass layer further comprises a conducting channel formed from at least partially bonded regions of metal-chalcogen and glass. The conducting channel can receive and expel metal ions in and out of it to set a particular resistance state for the memory element in response to write and erase voltages.

In another aspect, embodiments of the invention provide a method for changing the resistance state of a resistance variable memory element. A conditioning voltage is applied to produce a conducting channel within a glass network. The conducting channel can receive and expel metal ions to set a particular resistance state for the memory element through subsequent programming voltages, such as write and erase voltages.

These and other features and advantages of exemplary embodiments of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including but not limited to a glass, plastic, or semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures which may not be silicon-based. When reference is made to a semiconductor substrate in the following description, previous process steps may have been utilized to form regions or junctions in and/or over the base semiconductor or foundation.

Applicant has discovered that metal-chalcogen regions, such as silver-selenide, formed in a chalcogenide glass layer, for example, germanium-selenide, can be polarized upon application of a conditioning voltage and align to form a conducting channel within the chalcogenide glass layer. The conducting channel alters the resistance state of the glass from a very high resistance state, e.g. 1 GΩ, to a medium resistance state, e.g., 10 MΩ. A subsequently applied write voltage, having an energy lower than that of the conditioning voltage, can then program the glass to a lower resistance state, e.g. 10kΩ, by causing available metal ions to move into the conducting channels where they remain after the write voltage is removed. The metal ions within the conducting channel can be removed by application of a negative polarity erase voltage. Because the conducting channel is previously formed by the conditioning voltage before a write or erase operation occurs, higher speed switching of the glass between resistance states can be achieved compared to trying to form and completely decompose conductive pathways each time the glass is written or erased to a resistance state. The glass layer can be used to construct memory elements.

For purposes of a simplified description, memory elements are described below in which a metal-chalcogen is described as silver-selenide, and the chalcogenide glass as germanium-selenide. However, these specific materials are not considered as limiting the invention.

The invention will now be explained with reference to FIGS. 1A–F; 2A–2F; 3A–3F; and 4A–4-F, which respectively illustrate exemplary embodiments of a resistance variable memory element 100, 101, 102 and 103, and their methods of formation and operation, in accordance with the invention.

Figure 1A:
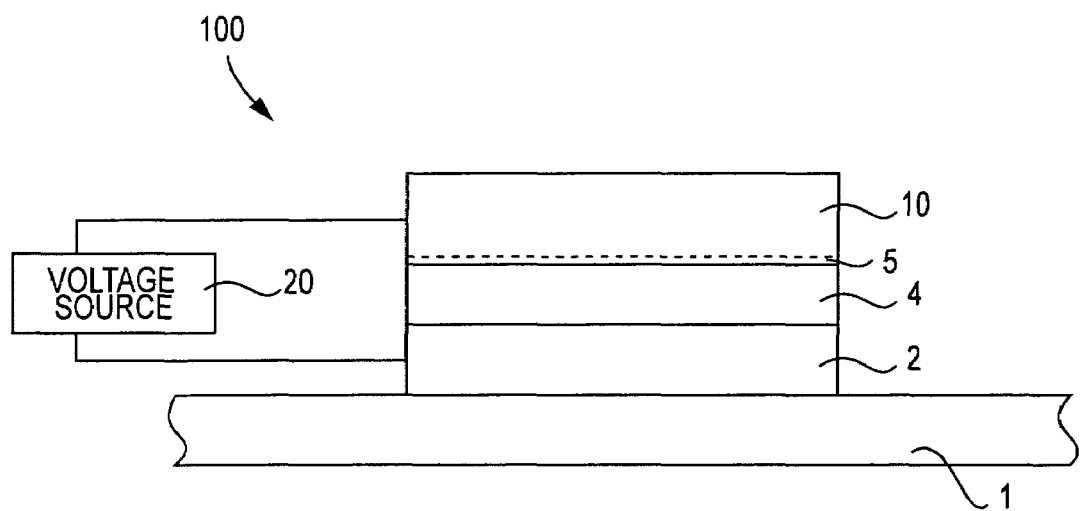
FIGS. 1A–1F illustrates a cross-sectional view of a resistance variable memory device fabricated in accordance with a first embodiment of the invention.

FIG. 1A depicts a first exemplary embodiment of a resistance variable memory element 100 and its method of formation in accordance with the invention. A first electrode 2 is formed over a substrate 1. The first electrode 2 may comprise a conductive material, for example, various metals such as, one or more of tungsten, tantalum, aluminum, platinum, silver, or titanium nitride, among others. In addition, the first electrode 2 can comprise a conductively-doped semiconductor material. The first electrode 2 should preferably not produce or expel metal ions, as discussed below.

Although FIG. 1A illustrates a first electrode 2 provided on substrate 1, it should be appreciated that additional layers may be provided between electrode 2 and the substrate 1. For instance, a barrier layer may be used to prevent migration of metal ions from layer 2. In addition, a semiconductor substrate 1 containing circuit layers covered with an insulating layer can be provided below first electrode 2 if desired.

Next, a glass layer 4 is formed over the first conductive electrode 2. The glass layer 4 is electrically coupled to electrode 2. The glass layer 4 is preferably a chalcogenide glass layer 4 that has been doped, e.g. photodoped, with a metal ion such as silver (Ag), and is more preferably a germanium-selenide glass layer 4 having a $Ge_xSe_{100-x}$ stoichiometry doped with Ag ions. The stoichiometric range for glass layer 4 is preferably from about $Ge_{18}Se_{82}$ to about $Ge_{25}Se_{75}$, and is more preferably about $Ge_{25}Se_{75}$ when metal ions, such as Ag ions, are provided in the glass layer 4 by a doping process. Glass layer 4 is formed to a thickness of from about 150 Å to about 600 Å thick, and is preferably about 500 Å thick.

Although glass layer 4 is described as a chalcogenide glass layer, other suitable glass layers may be employed as well. For instance, suitable glass material compositions for the glass layer 4 can include, but are not limited to, AsSe (arsenic-selenide, such as $As_3Se_2$), GeS (germanium-sulfide), and combinations of Ge, Ag, and Se, among others. Any one of the suitable glass materials for glass layer 4 and may further comprise small concentrations of dopants such as nitrogen nitrides, metals, and other group 13–17 elements from the periodic table.

The formation of the chalcogenide glass layer 4 having a stoichiometric composition such as $Ge_{25}Se_{75}$ in accordance with one exemplary embodiment of the invention, can be accomplished by any suitable method. For instance, by evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry, are some non-limiting examples of methods which can be used to form the glass layer 4.

After the chalcogenide glass layer 4 is formed, metal ions are doped into the glass layer 4 by a photodoping process. For instance, the chalcogenide glass layer 4, such as $Ge_{25}Se_{75}$, can be photodoped with a metal such as Ag. Metal ions can be driven into the glass layer 4 by applying a metal (Ag) layer on top of the glass layer 4 and exposing the glass layer 4 and metal layer to visible radiation. The metal layer can be formed over the glass layer 4, for example, by sputtering, physical vapor deposition, or other well-known techniques in the art.

Figure 1B:
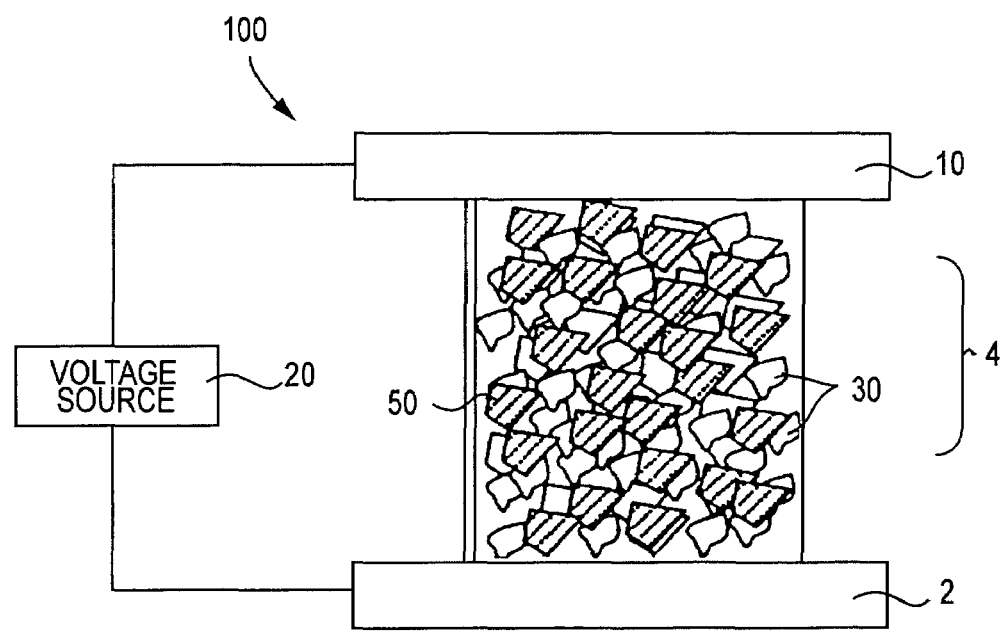

The metal doping of glass layer 4 causes the glass layer 4 to contain polarizable metal-chalcogen regions 30 and glass backbone regions 50, as shown in FIG. 1B. In this context, polarizable regions are regions which can physically align in the presence of a suitable voltage applied across a memory element.

It should be appreciated that the polarizable metal-chalcogen regions 30 are distinct regions within the glass layer 4. When glass layer 4 is doped with a metal ion, the glass layer 4 will phase separate into polarizable metal-chalcogen regions 30 and glass backbone regions 50. See Maria Mitkova, et al., *Dual Chemical Role of A as an Additive in Chalcogenide Glasses*, PHYSICAL REVIEW LETTERS, Nov. 8, 1999, at 3848–3851. If Ag is used as the dopant metal ion and germanium selenide, e.g. $Ge_{25}Se_{75}$, is used for glass layer 4, the polarizable metal-chalcogen regions 30 are $Ag_2Se$ regions within a germanium selenide backbone. In essence, the glass backbone regions 50 are non-metal containing glass regions with a stoichiometry determined by the loss of selenium (Se) from the germanium selenide glass to the formation of $Ag_2Se$.

Referring back to FIG. 1A, a second electrode 10 is then formed over the glass layer 4 and any residual metal ions, e.g. Ag, remain in glass layer 4 to complete the formation of the resistance variable memory element 100. The second electrode 10 may comprise any conductive material, for example, various metals, such as, one or more of tungsten, tantalum, aluminum, platinum, silver, or titanium nitride among others. In addition, the second electrode 10 can comprise a conductively-doped semi-conductive material, e.g., doped polysilicon.

Although electrode 10 may be directly applied to glass layer 4, in a preferred embodiment, the second electrode 10 is in contact with an intermediate metal-containing layer 5, which is provided over glass layer 4. This intermediate metal-containing layer 5 is preferably a layer comprising Ag.

Although the doping of metal, e.g., Ag, into the glass layer 4 will produce metal ions used, e.g, Ag ions within glass layer 4, the presence of the metal-containing layer 5 will serve as an additional source and receptacle for metal ions during write and erase operations. For example, for a germanium selenide glass layer 4 backbone containing polarizable $Ag_2Se$ metal-chalcogen regions 30, during a 'write' process, the metal-containing layer 5 can be Ag and is a source of metal ions, e.g., Ag, which enter glass layer 4. During an 'erase' process, the metal-containing layer 5 is the receptacle of the metal ions, e.g., Ag that move out of the glass layer 4.

In another exemplary embodiment, the metal containing layer 5 is omitted and the top electrode 10 is formed of a material capable of donating and receiving metal ions. For example, top electrode 10 can be made of silver which would be in contact with glass layer 4, and would then become a source and receptacle of metal ions during a write and erase operation. It is also possible to use an electrode 10, which donates or receives metal ions with metal-containing layer 5, which also donates or receives metal ions, in combination.

It should be appreciated that the first electrode 2 and the second electrode 10 can comprise the same or different materials. However, for example, if the first electrode 2 and the second electrode 10 comprise the same material such as tungsten or any other non-metal ion comprising metal, one side of the memory element 100, preferably the side with the second electrode 10, must have an excess of metal ions, e.g., Ag which, in the preferred embodiment, is metal-containing layer 5.

Because the metal ions, e.g., Ag ions which enter and leave glass 4 comes from layer 5, if provided, or layer 10, if layer 5 is not provided, it is preferable that electrode 2 not donate any metal ions. As a result, although intervening barrier layers are not illustrated in the FIG. 1A embodiment, intervening barrier layers can be present to prevent metal ion migration from electrode 2 into glass layer 4, or from electrode 10 into glass layer 4. The barrier layers, if provided, should not contain mobile metal ions.

A method of operating and manipulating the resistance state of the memory element depicted in FIG. 1A will now be described in reference to FIGS. 1B–1F.

Reference is now made to FIG. 1B which is a cross-sectional view of the memory element 100 of FIG. 1A prior to application of a conditioning voltage. As FIG. 1B illustrates, the chalcogenide glass regions 50 and polarizable metal-chalcogen regions 30 have no long range order, i.e., they are randomly distributed. For a germanium selenide glass layer 4 and Ag ion configuration, the doped chalcogenide glass layer 4, contains regions of germanium-selenide 50 and regions of polarizable silver-selenide 30. Free Ag ions may also be present in glass layer 4. The germanium-selenide regions 50 serve as the glass backbone for memory element 100.

Figure 1C:
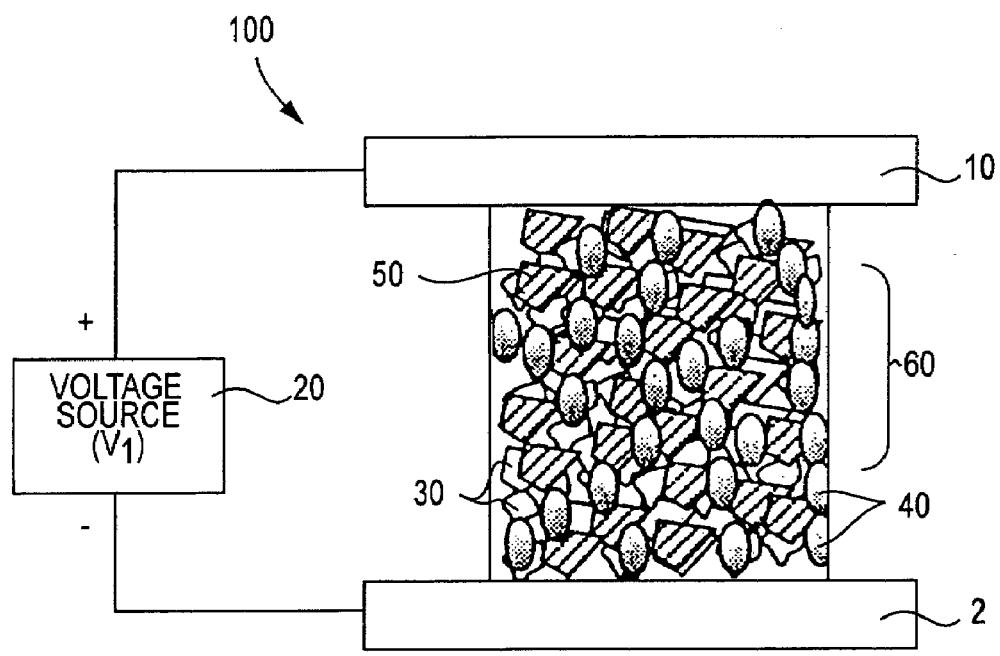

Referring now to FIG. 1C, when a conditioning voltage ($V_1$) of suitable energy, for example, is applied from a voltage source (DC) 20, one or more regions of silver-selenide 30 will polarize, that is, align to form a conducting channel 60. The aligned silver-selenide regions 40 form conducting channel 60 which spans the entire thickness of glass layer 4. The application of $V_1$ induces the alignment of the polarizable silver-selenide regions. It has been found that a conditioning voltage ($V_1$) about 200 mV under DC switching conditions and about 1.7V, 500 ns under AC conditions, is sufficient to physically align the $Ag_2Se$ regions 30 and form the conducting channel 60.

After the conditioning voltage $V_1$ is applied, memory element 100 is in a 'medium' state of resistance. Prior to application of the conditioning voltage illustrated in FIG. 1B, the memory element 100 is in a 'high' state of resistance. As a non-limiting example, a 'high' state of resistance for memory element 100 can be greater than 1 GΩ. A 'medium' state of resistance, produced by the alignment of the $Ag_2Se$ regions 30 can be around 1 MΩ. FIG. 1C illustrates the memory element 100 in the 'medium' state of resistance after applying a conditioning voltage $V_1$.

The conditioning voltage $V_1$ is at a higher potential than subsequent potentials used to write, read, or erase the memory element 100. This is due to the initial disorder of the polarizable silver-selenide regions 30, as illustrated in FIG. 1B. Prior to application of the conditioning voltage $V_1$, the structure of the memory element 100 is in the most disordered state. Thus, to bring the memory element 100 into a more structured state illustrated in FIG. 1C, a conditioning voltage $V_1$ which is larger than subsequently applied write, erase or read voltages is required.

Any suitable number, including all of the polarizable regions of silver-selenide 30, can be polarized to form conducting channel 60 which extends throughout the thickness of glass layer 4. The amplitude of $V_1$, necessary to induce formation of conducting channel 60, will depend upon the pulse width, glass layer 4 composition, and thickness. With an exemplary embodiment of $Ag_2Se$ formed within a glass with an initially $Ge_{25}Se_{75}$ stoichiometry before addition of Ag, having a thickness of 500 Å, and a metal-containing layer 5 of Ag having a thickness of 200 Å, a 1.7V pulse having a duration of 500 ns was found to be sufficient.

The pre-established conducting channel 60 allows additional metal ions within the glass layer 4, or from the metal-containing layer 5, and/or electrode 10, to move into and out of the conducting channel 60 upon application of a potential across the two electrodes. Thus, the resistance state of the memory element 100 can be changed quickly. In other words, the movement of the Ag ions in the conducting channel 60 upon application of a write voltage $V_2$, which has a potential less than the conditioning voltage $V_1$, can lower the resistance state of the memory element 100 from the medium resistance state of e.g., 1 MΩ, to a lower resistance state of e.g., 10 kΩ. When an erase voltage of inverse polarity to the write voltage is applied, the silver ions are driven out of the conducting channel 60 and back into the glass layer 4 and metal-containing layer 5, and/or electrode 10, increasing the resistance state of the memory element 100 back to the medium resistance state. The erase voltage need only be sufficient to drive Ag ions out of the conducting channel 60. The conducting channel 60 is not dispersed and is still maintained.

Because the conducting channel 60 always remains intact, the switching speeds and response of the memory element 100 are enhanced because the Ag ions can move into and out of the conducting channel 60 without the need to reform the channel 60 every time the memory element 100 is switched.

It should be appreciated that the presence of the glass regions 50, here, germanium-selenide regions 50, serve to isolate the polarizable metal-chalcogen regions 30 from each other, here, polarizable silver-selenide regions 30. The germanium-selenide regions 50 also restrict the mobility and provide isolation between the polarized silver-selenide regions 40. As a result, once memory element 100 is written to a low resistance state, enhanced data retention arises due to the polarized silver-selenide regions 40 being held more rigidly in the glass backbone 50.

It should also be appreciated that although only one conducting channel 60 is illustrated in FIGS. 1C–1F, one or more conducting channels 60 may be formed in glass layer 4. Moreover, conditioning of the memory element 100 is conducted only once, and after the memory element 100 is conditioned, the conditioned structure 100 will operate through normal write and erase operations.

Figure 1D:
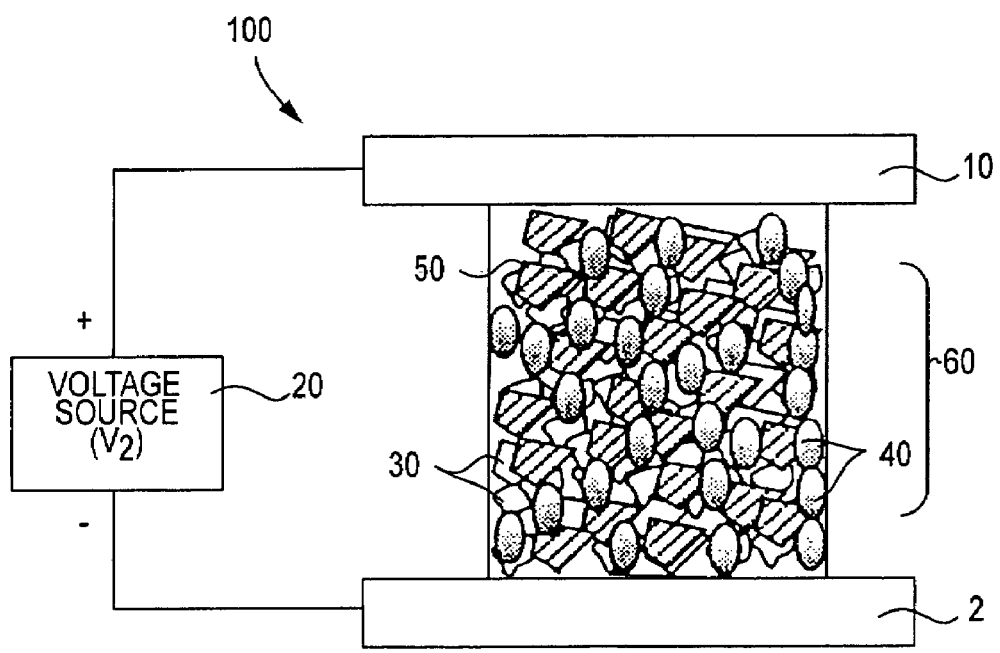

FIG. 1D illustrates the memory element 100 after a write operation is performed. A write voltage $V_2$ is applied from a voltage source 20, to 'write' information into the resistance variable memory element 100. The write voltage $V_2$, occurs at a lower potential than the conditioning voltage $V_1$. For example, if the conditioning pulse is 200 mV, memory element 100 should be written with a 'write' voltage $V_2$ of less than 200 mV. As shown in FIG. 1D, the additional Ag ions enter the pre-established conductive channel 60 to further complete the conductive path and lower the resistance of the memory element 100. With this exemplary embodiment of $Ag_2Se$ formed within a glass with an initially $Ge_{25}Se_{75}$ stoichiometry before addition of Ag, having a thickness of 500 Å, and a metal-containing layer 5 of Ag of thickness 200 Å, a write voltage of about 700 mV with a pulse width of about 100 ns was found to be sufficient.

Applying the write voltage $V_2$ causes Ag ions to move into the conducting channel 60 from the side with the positive potential, here electrode 10. The Ag ions are supplied from any free Ag ions within glass layer 4, and the metal-containing layer 5, and/or electrode 10. FIG. 1D illustrates memory element 100 in the 'low' state of resistance, e.g., around 10 kΩ.

It should be appreciated that the pre-established conductive channels 60 may be affected by high temperatures as the metal ions and polarizable metal-chalcogen regions 30 become more mobile. Accordingly, when this occurs, it may be desirable to periodically refresh the memory elements by periodically reapplying the conditioning pulse $V_1$ to reset the conductive channel 60 and thereby resetting the memory element 100 to its medium resistance state.

Figure 1E:
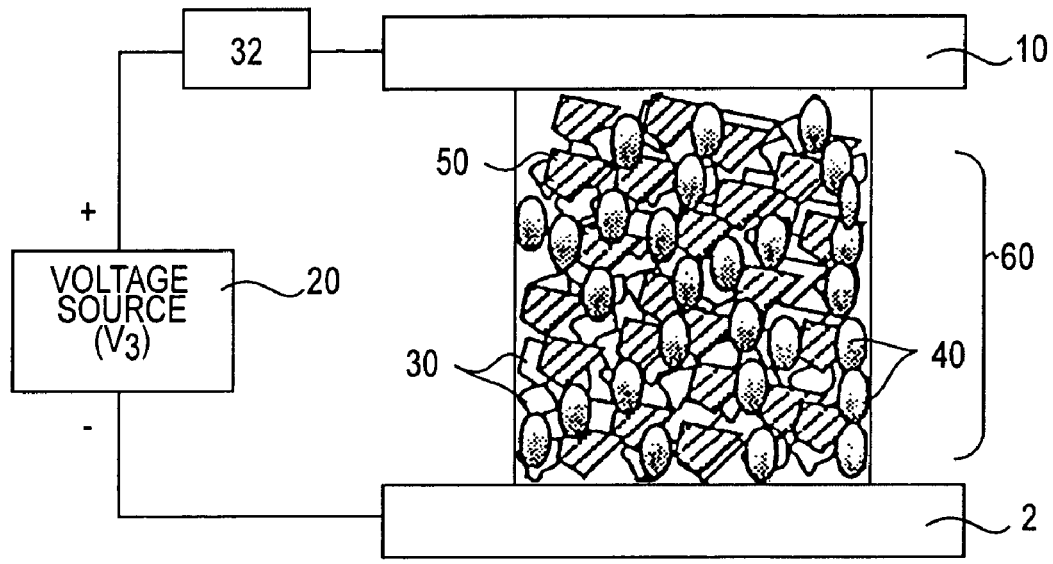

Referring now to FIG. 1E, a 'read' operation is illustrated in which a read potential $V_3$, which is less than write potential $V_2$, is applied to the memory element 100. Current flow through the memory element 100 is sensed by a current sensing amplifier 32, which provides an output representing the resistance state of the memory element 100.

A read voltage $V_3$, which is below the threshold for writing the memory element 100, e.g., $V_2$, is sufficient. Where the write voltage $V_2$ is about 700 mV with a pulse duration of 100 ns, the read voltage $V_3$ can then be a potential less than about 200 mV with a pulse width less than about 500 ns. The read voltage $V_3$ does not disturb other memory elements in a memory element array, which are in the pre-conditioned medium resistance 'OFF' state, since the read voltage $V_3$ is lower than the write voltage $V_2$. The read voltage $V_3$ may be applied in various manners, such as a sweep voltage, pulse voltage, or step voltage, among other methods.

Figure 1F:
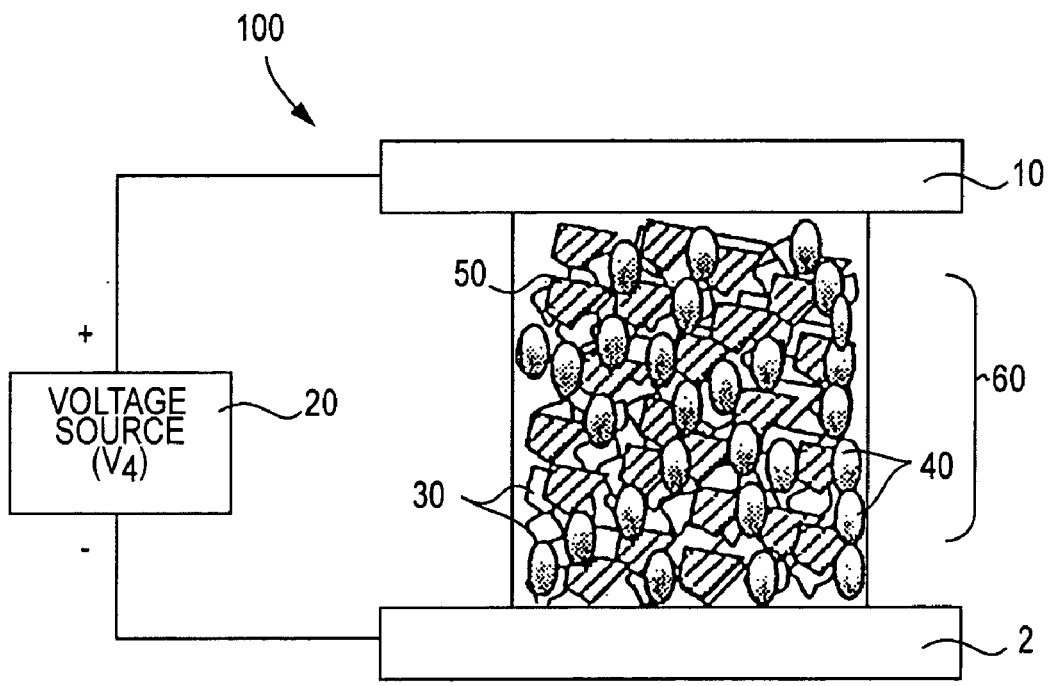

FIG. 1F illustrates the memory element 100 when an erase voltage is applied across the electrodes 2 and 10 from voltage source 20. An erase voltage $V_4$ having an inverse polarity from the write voltage $V_2$ is applied from electrode 10 to electrode 2 to erase the memory element 100. The erase voltage $V_4$ may also be of a smaller absolute magnitude than the write voltage $V_2$.

The application of an erase voltage $V_4$ moves Ag ions out of the conducting channel 60 toward the electrode with the negative potential. This is electrode 10 in FIG. 1F. The Ag ions will move out of the conducting channel 60 and into the metal-containing layer 5, the glass layer 4, and/or electrode 10 if the electrode 10 contains Ag. Stated in another way, the erase is essentially a function of removing Ag ions from conducting channel 60. As a result, the erase is complete when the resistance of the memory element 100 returns to the 'medium' state of resistance, i.e., around 1 MΩ.

It is important to note that after an erase operation, the conducting channel 60 of FIG. 1C remains intact; thus, allowing for faster write and erase switching times. In other words, the erase voltage $V_4$ returns the memory element 100 to the state of resistance illustrated in FIG. 1C. Thus, the erase voltage $V_4$ should be low enough to cause a resistance shift in the memory element 100, but not of a magnitude which would destroy the conducting channel 60.

It should be appreciated that the conditioning, write, and erase pulse widths are dependent on the electric field amplitude, i.e., the applied voltage. Thus, shorter pulses will require higher voltages for $V_1$, $V_2$, and $V_4$ and vice versa. This is expected since the movement of Ag ions in the conducting channel 60 has an energy requirement for movement into and out of the conducting channel 60, which in turn is dependent upon the concentration of Ag ions which enters or leaves the conducting channel 60.

Figure 2A:
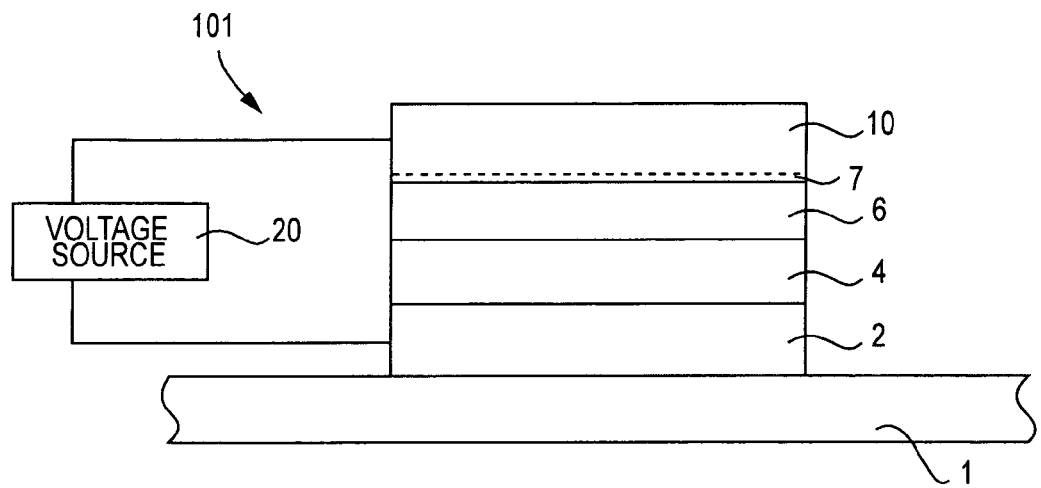
FIGS. 2A–2F illustrates a cross-sectional view of a resistance variable memory device fabricated in accordance with a second embodiment of the invention.

Reference is now made to FIG. 2A which shows another exemplary embodiment of the invention and its method of formation.

The FIG. 2A embodiment has a first electrode 2 formed over a substrate 1. The first electrode 2 may comprise any of the conductive materials listed above for the same electrode as in the FIG. 1A embodiment. Similar to the FIG. 1A embodiment, additional barrier layers may be provided between electrode 2 and substrate 1, if required to prevent metal ion migration. The barrier layers, if provided, should not contain mobile metal ions.

Next, a glass layer 4 such as a chalcogenide glass layer 4 is formed over the first electrode 2. The glass layer 4 is electrically coupled to electrode 2. The glass layer 4 is preferably a chalcogenide glass layer 4, and more preferably, a germanium-selenide glass layer 4 having a $Ge_xSe_{100-x}$ stoichiometry. The stoichiometric range for chalcogenide glass layer 4 as depicted in the FIG. 2A embodiment is preferably from about $Ge_{20}Se_{80}$ to about $Ge_{43}Se_{57}$, and is more preferably about $Ge_{40}Se_{60}$. Glass layer 4 is formed to a thickness of from about 150 Å to about 500 Å thick, and preferably is about 150 Å thick.

For purposes of a simplified description, the glass layer 4 of structure 101 is described further below as a chalcogenide glass layer 4 and more specifically, a $Ge_{40}Se_{60}$ layer. However, other suitable glass or polymer layers may be employed without affecting the utility of the invention. For instance, suitable glass material compositions for the glass layer 4 can include but are not limited to, SiSe (silicon-selenide), AsSe (arsenic-selenide, such as $As_3Se_2$), GeS (germanium-sulfide), and combinations of Ge, Ag, and Se, among others. Any one of the suitable glass materials may further comprise small concentrations of dopants such as nitrogen nitrides, metals, and group 1, 2, and 13–17 elements from the periodic table.

The formation of the glass layer 4 having a stoichiometric composition such as $Ge_{40}Se_{60}$ in accordance with one exemplary embodiment of the invention, can be accomplished by any suitable method. For instance, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry, are some non-limiting examples of methods which can be used to form the glass layer 4. It should be appreciated that the glass layer 4 may comprise one or more layers of a glass material.

Still referring to FIG. 2A, a metal-containing layer 6, preferably silver-selenide, is deposited over the chalcogenide glass layer 4. However, any suitable metal-containing layer 6 may be used so long as it interacts with the glass backbone such that it allows the transfer of metal ions into glass layer 4 upon application of a sufficient voltage across a memory element of which layers 4 and 6 are a part. For instance, besides silver-selenide, the metal-containing layer 6 may comprise silver, copper, or other transition metals. Other suitable metal-containing layers 6 which may be used include glass layers doped with a metal.

Preferably, the metal-containing layer 6 will comprise the same type of chalcogen component as is present in glass layer 4. For example, if glass layer 4 is $Ge_xSe_{100-x}$, metal-containing layer 6 may be $Ag_2Se$. The metal-containing layer 6 is formed to a thickness of from about 300 Å to about 1200 Å thick, and preferably is about 470 Å thick.

It should be appreciated that excess metal ions need to be provided either by metal-containing layer 6 itself, or through some other means for donation to glass layer 4. For instance, metal-containing layer 6 can be formed to contain excess metal ions. That is, $Ag_{2+x}Se$, where x represents excess Ag ions. Alternatively, if the excess metal ions are not part of the metal-containing layer 6, a separate second metal-containing layer 7 with a sufficient thickness that gives the desired excess amount of metal ions, e.g., Ag ions to the metal-containing layer 6 may be provided over or beneath the first metal-containing layer 6.

An electrode 10 is provided over the conducting metal-containing layer 6, if metal-containing layer 7 is omitted, or is provided over metal-containing layer 7 if the latter is provided. Electrode 10 need not donate any metal ions if one or both of layers 6 and 7 provide sufficient metal ions for memory element operation.

In an exemplary embodiment, the second metal-containing layer 7 is provided and serves as a source and receptacle for metal ions doing write and erase operations. In another exemplary embodiment, the top electrode 10 may be the source and receptacle of additional metal ions when the second metal-containing layer 7 is omitted, and excess metal ions are not available in layer 6. In this case, the top electrode 10 may comprise silver, which donates and receives silver ions to and from glass layer 4.

Some non-limiting examples of forming the metal-containing layer 6 are physical vapor deposition techniques such as evaporative deposition, sputtering, chemical vapor deposition, co-evaporation, or depositing a layer of selenium above a layer of silver to form silver-selenide ($Ag_2Se$) can also be used. It should be appreciated that the metal-containing layer 6 may comprise one or more layers of a metal-containing material. For purposes of a simplified description, FIGS. 2A–2F refer to the first metal-containing layer 6 as a silver-selenide layer 6 and the second metal-containing layer 7 as a silver layer 7. In this case electrode 10 does not contribute metal ions to, or receive metal ions from glass layer 4.

The second electrode 10 may comprise any of the materials described above for electrode 10 of the FIG. 1A embodiment. FIG. 2A illustrates that the second electrode 10 is in contact with an upper surface of the second metal-containing layer 7; however, intervening layers may be provided between layers 7 and 10, if desired. As described above, the second metal-containing layer 7 can provide additional Ag ions. In addition, the second electrode 10 can comprise Ag which can also provide additional Ag ions if the second metal-containing layer 7 is omitted from memory element 101.

In another exemplary embodiment, the metal containing layer 7 is omitted and the top electrode 10, which is in contact with metal-containing layer 6, can provide and receive metal ions, e.g., Ag ions, and can be the source and receptacle of metal ions during a write and erase operation. It is also possible to use an electrode 10, which donates or receives metal ions with metal-containing layer 7, which also donates or receives metal ions in combination. It should be appreciated that the first electrode 2 and the second electrode 10 can comprise the same or different materials.

As described above, the first and second metal-containing layers 6 and 7 can provide Ag ions. In addition, the second electrode 10 can comprise Ag, if used, which can also provide Ag ions if the second metal-containing layer 7 is omitted from memory element 101, and layer 6 does not have excess Ag ions. Because the metal ions, e.g., Ag ions which enter and leave glass 4 is coming from the second metal-containing layer 7, if provided, or electrode 10, if layer 7 is not provided and layer 6 does not have excess Ag ions., it is preferable that electrode 2 not donate any metal ions As a result, although intervening barrier layers are not illustrated in the FIG. 2A embodiment, intervening barrier layers can be present to prevent metal ion migration from electrode 2 into glass layer 4, or from electrode 10 into glass layer 4. Barrier layers, if provided, should not contain mobile metal ions.

A method of operating and manipulating the resistance state of the memory element 101 depicted in FIG. 2A will now be described in reference to FIGS. 2B–2F. For exemplary purposes, the methods of operation described in FIGS. 2B–2F is for a memory element 101 comprising a $Ge_{40}Se_{60}$ glass layer 4 that is 150 Å thick, an $Ag_2Se$ layer 470 Å thick, and a silver layer 200 Å thick.

Figure 2B:
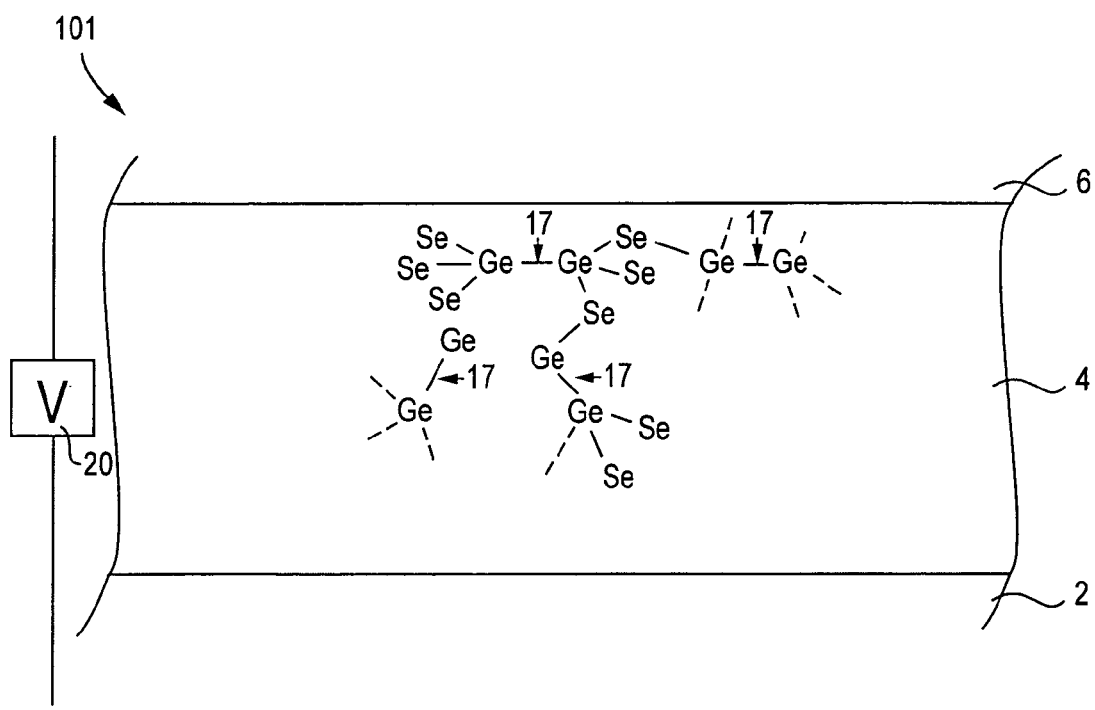

Reference is now made to FIG. 2B which is a cross-sectional view of the glass layer 4 in memory element 101 of FIG. 2A prior to application of a conditioning voltage across memory element 101. As FIG. 2B illustrates, the germanium-selenide glass layer 4 has no long range order, i.e., it has non-uniform distribution of Ge and Se within the glass layer 4. FIG. 2B further illustrates the presence of germanium-germanium (Ge—Ge) bonds 17 throughout the glass layer 4. The presence of another species which can provide a more thermodynamically favorable energy than the Ge—Ge bond energy will ultimately break the Ge—Ge bonds 17 and bond with the previously bonded Ge.

Figure 2C:
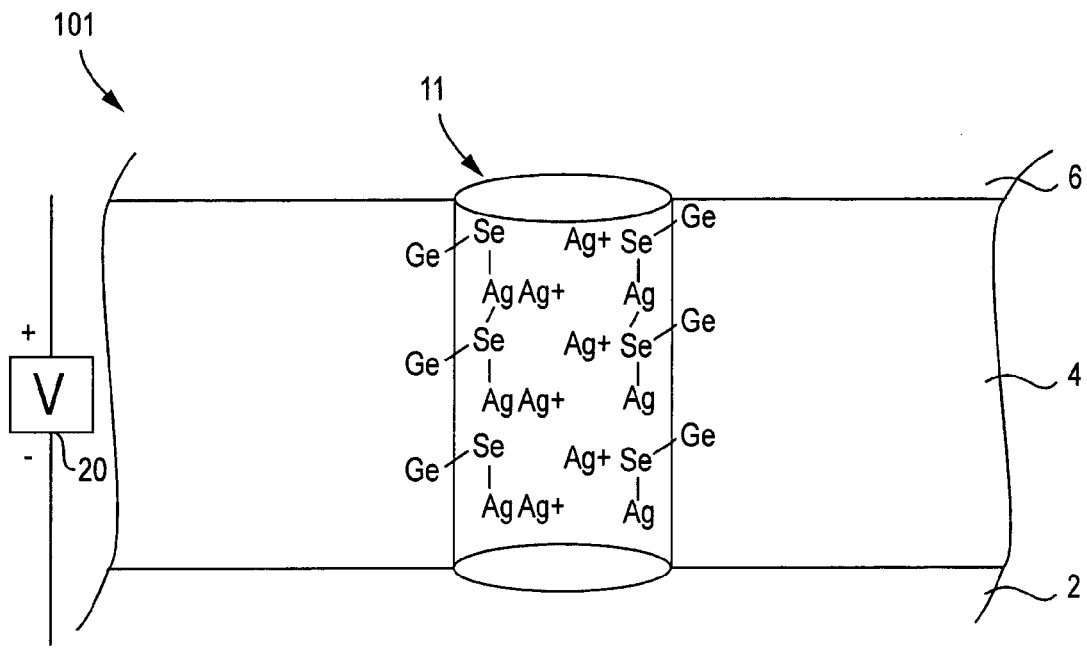

Referring now to FIG. 2C, a conditioning pulse having a potential $V_1$, is applied across memory element 101. The conditioning pulse causes metal chalcogenide, e.g., $Ag_2Se$ from the layer 6 to enter into glass layer 4, thereby breaking Ge—Ge bonds 17 in the glass layer 4 and to form conductive channel 11 within the glass 4 backbone. The conditioning pulse's parameters are dependent upon the composition and thickness of the various layers comprising memory element 101.

For a $Ge_{40}Se_{60}$ glass layer 4, a first $Ag_2Se$ layer 6, and a second Ag layer 7 having the construction described, a conditioning pulse having a pulse duration from about 10 to about 500 ns and greater than about 700 mV has been found sufficient to form conductive channel 11. The amplitude of the conditioning pulse will depend on the pulse width. The conducting channel 11 will form in the weakest part of the chalcogenide glass material 4, i.e., in the areas that require the least amount of energy to form the conductive channel 11. The conditioning pulse causes the conducting channel 11 to form by re-orientation of the GeSe and $Ag_2Se$ regions, as shown in FIG. 2C.

The $Ag_2Se$ provided from the first metal-containing layer 6, and driven into the glass layer's 4 backbone, assists in forming the conducting channel 11 as it bonds with the germanium-selenide, i.e., as the $Ag_2Se$ bonds to the glass. It should be appreciated that a plurality of conducting channels 11 can be formed in the chalcogenide glass layer 4. For purposes of a simplified description, only one conducting channel 11 is illustrated in FIGS. 2C–2F.

After application of the conditioning pulse, memory element 101 is in a "medium" state of resistance. Prior to application of a conditioning pulse, and as illustrated in FIG. 2B, memory element 101 is in a 'high' state of resistance where the germanium-selenide regions are not oriented. For instance, a 'high' state of resistance which arises after the conditioning pulse is applied to memory element 101 can be about 1 GΩ. A 'medium' state of resistance can be around 1 MΩ.

In the medium resistance state, the memory element 101 is still considered 'OFF' and remains in this conditioned state, with the $Ag_2Se$ regions, polarized and aligned in the direction of current flow, until the conducting channel 11 receives excess metal ions from the first metal-containing layer 6, if excess metal ions are present, and from the second metal containing layer 7, and/or electrode 10 during a 'write' operation.

Therefore, applying a conditioning pulse across the memory element 101 breaks the weak Ge—Ge bonds 17 within the $Ge_{40}Se_{60}$ glass layer 4 and allows $Ag_2Se$ and ions thereof to bond to germanium-selenide sites. In part, the conditioning pulse $V_1$, reorients the non-uniform state of the chalcogenide glass layer 4 (FIG. 2B) into a more organized and structured state having aligned $Ag_2Se$ areas as illustrated in FIG. 2C. However, the memory element 101 of FIG. 2C is still in a medium or 'OFF' state of resistance.

Figure 2D:
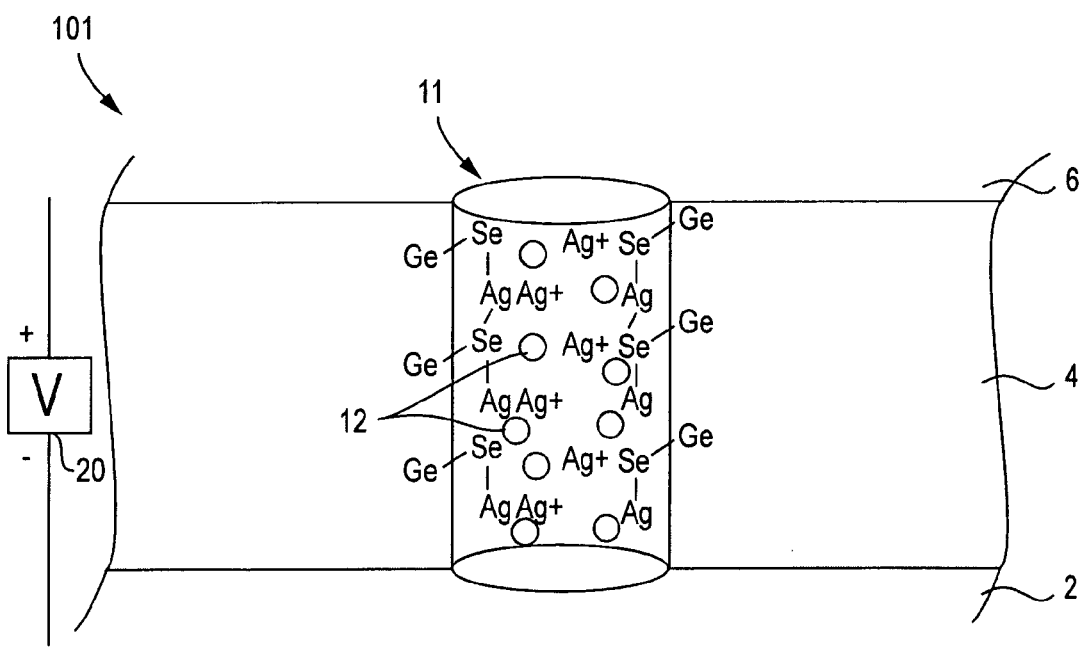

Referring now to FIG. 2D, during a 'write' operation, excess Ag ions from metal-containing layer 6, Ag ions from metal-containing layer 7, and/or electrode 10 enter the glass 4 and will cluster in the conducting channel 11, and more specifically, cluster to the germanium-selenide and $Ag_2Se$ bonded regions; thus, forming a low resistance conductive path as clustering structures 12 in FIG. 2D illustrate. These clustering structures 12, i.e., regions of Ag/Ag+, are formed throughout the conducting channel 11. The presence of the clustering structures 12 provides a low resistance state for memory element 101. A 'write' mode exists when a voltage $V_2$ less than the conditioning voltage $V_1$ is applied across memory element 101, thereby generating an 'ON' (low resistance) state for memory element 101. Low resistance is about 10 kΩ.

It should be appreciated that the portion of the glass backbone around the conducting channel 11 does not contain much Ag ions. In fact, the majority of the chalcogenide glass layer 4 does not contain Ag ions. The Ag ions from a 'write' operation proceed into the conducting channel 11 from the first metal-containing layer 6 if excess metal ions are present, the second metal-containing layer 7, and/or electrode 10. One exemplary write potential $V_2$ is preferably a pulse from about 8 to about a 150 ns that is less than the potential of $V_1$, e.g., less than 700 mV. A write potential $V_2$ of about 400 mV has been found to be adequate with the memory element 101. The amplitude of the write potential will vary depending on the pulse width.

As a result, during a write operation the Ag ions take the path of least resistance into glass layer 4. In this case, the path of least resistance is provided by the conducting channel 11. The Ag ions will migrate toward the negative potential, here, electrode 2, when applied across the memory element 101. Accordingly, the movement of the Ag ions into the conducting channel 11 renders channel 11 more conductive.

Figure 2E:
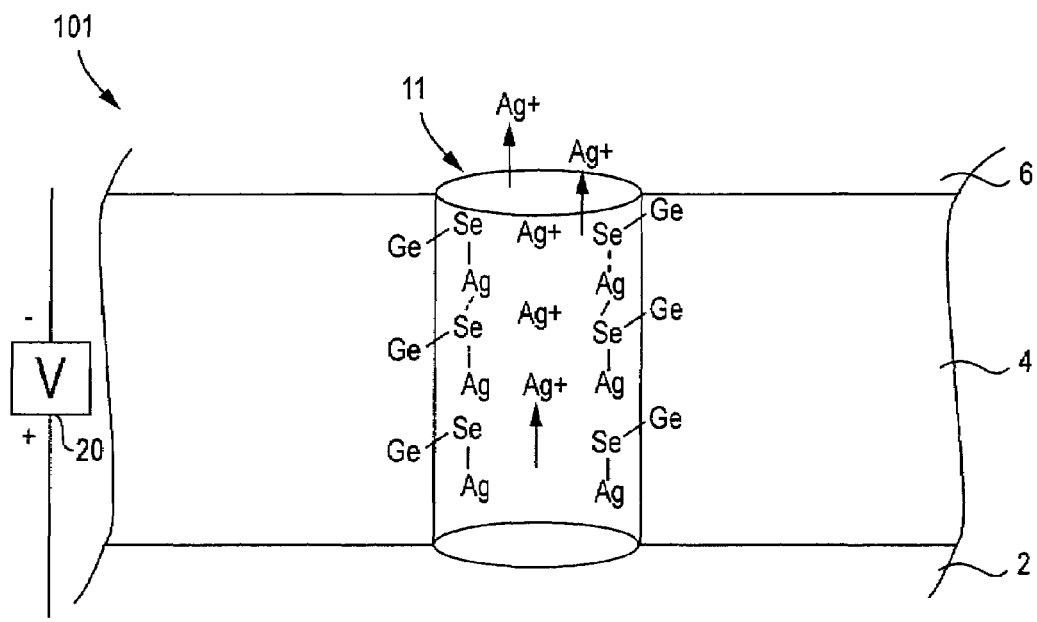

When an erase potential $V_4$, having an inverse polarity to that of the write potential $V_2$ is applied to the memory element 101, the Ag ions will leave conductive channel 11 and move back into the first metal-containing layer 6. The memory element 101 reverts back to the 'medium' state resistance, as illustrated in FIG. 2E. An exemplary erase potential $V_4$ is a pulse from about 8 to about 150 ns that is from about negative 400 mV (−400 mV) to about negative 700 mV (−700 mV) in amplitude. As with the write potential $V_2$, the amplitude of the erase potential $V_4$ will depend on the pulse width.

It should be appreciated that application of an erase potential $V_4$ from voltage source 20 across the structure 101, serves only to drive the free Ag ions (unbound Ag ions) out of the conducting channel 11 back to their original source The conducting channel 11 remains in place even after an erase potential $V_4$ is applied across the memory element 101, so long as the erase potential $V_4$ does not greatly exceed the magnitude of the conditioning potential $V_1$ in reverse polarity.

Figure 2F:
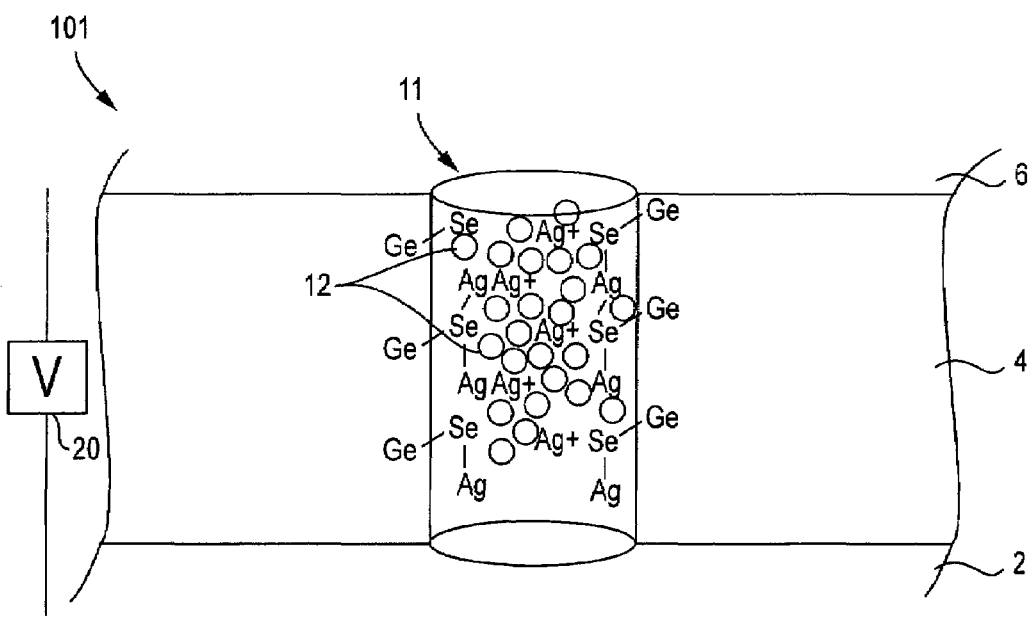

It has been further discovered that applying another positive potential $V_3$, to an already 'ON' memory element 101 structure, i.e, one in a low resistance state, illustrated in FIG. 2D, results in an even lower resistance 'ON' state caused by the presence of additional Ag/Ag+ ion clusters 12, as illustrated in FIG. 2F. In essence, applying multiple 'write' pulses to memory element 101 can reduce the resistance state of memory element 101 to a much lower resistance. In some instances, the resistance of memory element 101 can be well below 10 kΩ.

In an exemplary embodiment of memory element 101, a 10 ns, 1.7V conditioning pulse $V_1$ was applied to cause the memory element 101, initially at 1 GΩ, to move into a 'medium' state of resistance of approximately 1 MΩ. A 10 ns, 700 mV write pulse $V_2$ was applied to the memory element 101 to move it to a low resistance state of approximately 10 kΩ. A 10 ns, negative 550 mV erase pulse $V_4$ was applied to return the memory element 101 to a medium resistance state. It was also observed that applying a 10 ns, 700 mV write pulse $V_3$ repeatedly to the memory element 101 yielded lower and lower resistance states below 10 kΩ. Thus, the memory element 101 could be used to set different detectable logic states in accordance with the number of applied write pulses $V_3$.

For instance, a 'read' operation in which a read potential $V_5$, which is less than write potential $V_2$, can applied to the memory element 101. Current flow through the memory element 101 can be sensed by a current sensing amplifier, which can provide an output representing the resistance state of the memory element 101 (not pictured).

A read voltage $V_5$, which is below the threshold for writing the memory element 101, e.g., $V_1$, is sufficient. Where a 10 ns, 700 mV write pulse $V_2$ is used, the read voltage $V_5$ can then be in the range from any pulse less than about 500 ns and less than or equal to about 200 mV. The read voltage $V_5$ does not disturb other memory elements in a memory element array, which are in the pre-conditioned medium resistance 'OFF' state, since the read voltage $V_5$ is lower than the write voltage $V_2$. The read voltage $V_5$ may be applied in various manners, such as a sweep voltage, pulse voltage, or step voltage, among other methods.

FIG. 3A-3F depicts a third exemplary embodiment of a resistance variable memory device 102 constructed in accordance with the invention.

A first electrode 2 is formed over a substrate 1. The first electrode 2 may comprise any of the conductive materials listed above as in the FIGS. 1A and 2A embodiments.

Next, a first glass layer 4 is formed over the first electrode 2. The first glass layer 4 is electrically coupled to electrode 2. The first glass layer 4 can comprise the same materials as in prior embodiments and have the same stoichiometric ranges as the glass layer 4 in FIG. 2A. For purposes of a simplified description, the first glass layer 4 is described further below as a $Ge_{40}Se_{60}$ chalcogenide glass layer 4. Glass layer 4 is formed to a thickness of from about 150 Å to about 500 Å thick, and preferably is about 150 Å thick.

The formation of the chalcogenide glass layer 4, having a stoichiometric composition, such as $Ge_{40}Se_{60}$, can be accomplished by any of the methods described above for forming the glass layer 4 of FIG. 2A. The first glass layer 4 may comprise one or more layers of a glass material.

Figure 3A:
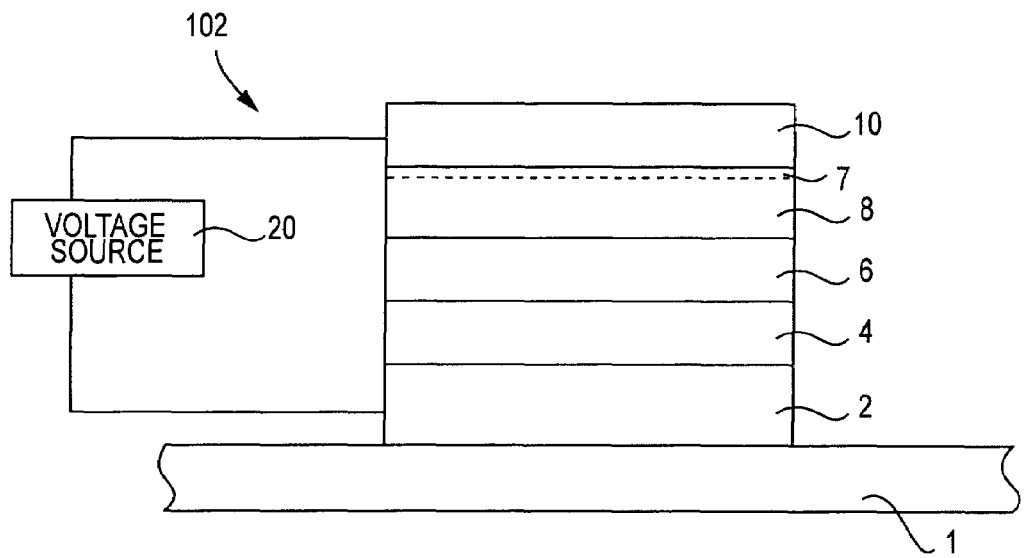
FIGS. 3A–3F illustrates a cross-sectional view of a resistance variable memory device fabricated in accordance with a third embodiment of the invention.

Still referring to FIG. 3A, a first metal-containing layer 6, preferably silver-selenide, is formed over the first chalcogenide glass layer 4. The formation of the first metal-containing layer 6, such as silver-selenide, can be accomplished by any of the methods described above for forming the metal-containing layer 6 of FIG. 2A. The first metal-containing layer 6 may comprise one or more layers of a metal-containing material. The first metal-containing layer 6 is formed to a thickness of from about 300 Å to about 1200 Å thick, and preferably is about 470 Å thick.

Next, a second glass layer 8 is formed over the first metal-containing layer 6. The second glass layer 8 allows deposition of silver above a silver-selenide layer 6, for instance. The second glass layer 8 can be utilized as a diffusion control layer to prevent metal ions from migrating from electrode 10 into the memory element 102. The second glass layer 8 is formed to a thickness of from about 100 Å to about 300 Å thick, and preferably is about 150 Å thick.

The formation and composition of the second glass layer 8 is the same as described above for the formation and composition of the glass layer 4 of FIG. 3A. For purposes of a simplified description, the second glass layer 8 is described as a chalcogenide glass layer having a stoichiometry similar to the first glass layer 4 i.e., $Ge_{40}Se_{60}$. Further, one or more layers of glass material can be provided if desired for glass layer 8. The second glass layer 8 may be formed to a thickness of from about 100 Å to about 300 Å thick, and preferably is about 150 Å thick.

Although the first glass layer 4 and the second glass layer 8 are described above as having a stoichiometry and material composition similar to each other i.e., $Ge_{40}Se_{60}$, it should be appreciated that the first glass layer 4 and the second glass layer 8 can possess different stoichiometries from each other, different thicknesses, and they can even be formed of different glasses.

As in the second embodiment, excess metal ions need to be provided in this embodiment as well, either by excess metal ions in the first metal-containing layer 6, by an optional second metal-containing layer 7 provided above glass layer 8, or by upper electrode 10. For instance, the first metal-containing layer 6 can be formed containing excess metal ions. Alternatively, if the excess metal ions are not part of the first metal-containing layer 6, i.e., added specifically or deposited with an excess metal, the metal ions need to be added as a separate second metal-containing layer 7 and/or an upper electrode 10. The second metal-containing layer 7 should have a sufficient thickness that gives the desired excess amount of metal ions to the glass layer 4.

The second metal-containing layer 7 can comprise any metal ions so long as it provides metal ions to enable formation of a conducting channel in the glass layer 4 after application of a conditioning pulse. For instance, the second metal-containing layer 7 may comprise silver or copper. In an exemplary embodiment, the second metal-containing layer 7 is present and serves as a source and receptacle for additional metal ions.

A second electrode 10 is formed over the second glass layer 8 or over the second metal containing layer 7, if provided, as shown in FIG. 3A, to complete the formation of the memory element 102. The second electrode 10 may comprise any of the conductive materials listed above for the electrode 10 described in reference to FIGS. 1A and 2A. FIG. 3A illustrates that the second electrode 10 is in contact with an upper surface of the second metal-containing layer 7; however, intervening layers may be provided between layers 7 and 10, if desired. As described above, the second metal-containing layer 7 can provide additional Ag ions. In addition, the second electrode 10 can comprise Ag which can also provide additional Ag ions if the second metal-containing layer 7 is omitted from structure 102.

It should be appreciated that the first electrode 2 and the second electrode 10 can comprise the same or different materials. However, for example, if the first electrode 2 and the second electrode 10 comprise the same material, such as tungsten or any other non-metal ion comprising metal, one side of the memory element 102, preferably the side with the second electrode 10, must have an excess of metal ions, Ag in the preferred embodiment, either in layer 6 or preferably as the second metal-containing layer 7.

As a result, although intervening barrier layers are not illustrated in the FIG. 3A embodiment, intervening barrier layers can be present to prevent metal ion migration from electrode 2 into glass layer 4, or from electrode 10 into glass layer 4, when the excess metal ions are provided by layers 6 and/or 7. Barrier layers, if provided, should not contain mobile metal ions.

A method of operating and manipulating the resistance state of the memory element 102 depicted in FIG. 3A is described below in reference to FIGS. 3B–3F. For exemplary purposes, the methods of operation described in FIGS. 3B–3F is for a memory element 102 comprising a first $Ge_{40}Se_{60}$ glass layer 4 that is 150 Å thick, an $Ag_2Se$ layer 470 Å thick, a second $Ge_{40}Se_{60}$ glass layer 8 that is 150 Å thick and a silver layer 200 Å thick.

Figure 3B:
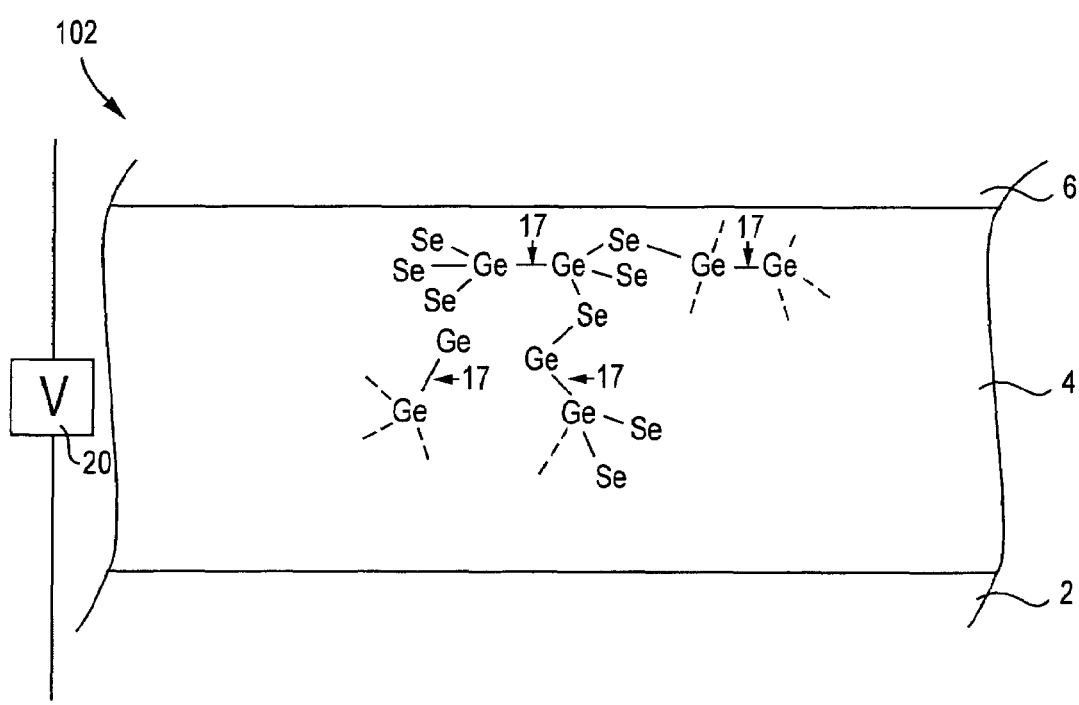

Reference is now made to FIG. 3B which is a cross-sectional view of the glass layer 4 of memory element 102 of FIG. 3A prior to application of a conditioning pulse $V_1$. As FIG. 3B illustrates, the glass layer 4, formed of $Ge_{40}Se_{60}$, has no long range order. FIG. 3B further illustrates the presence of germanium-germanium (Ge—Ge) bonds 17 throughout the glass layer 4. The presence of another species which can provide a more thermodynamically favorable energy will break the Ge—Ge bonds 17 and bond with the previously bonded Ge. Accordingly, the Ge—Ge bond 17 is not strong and can easily be broken.

Figure 3C:
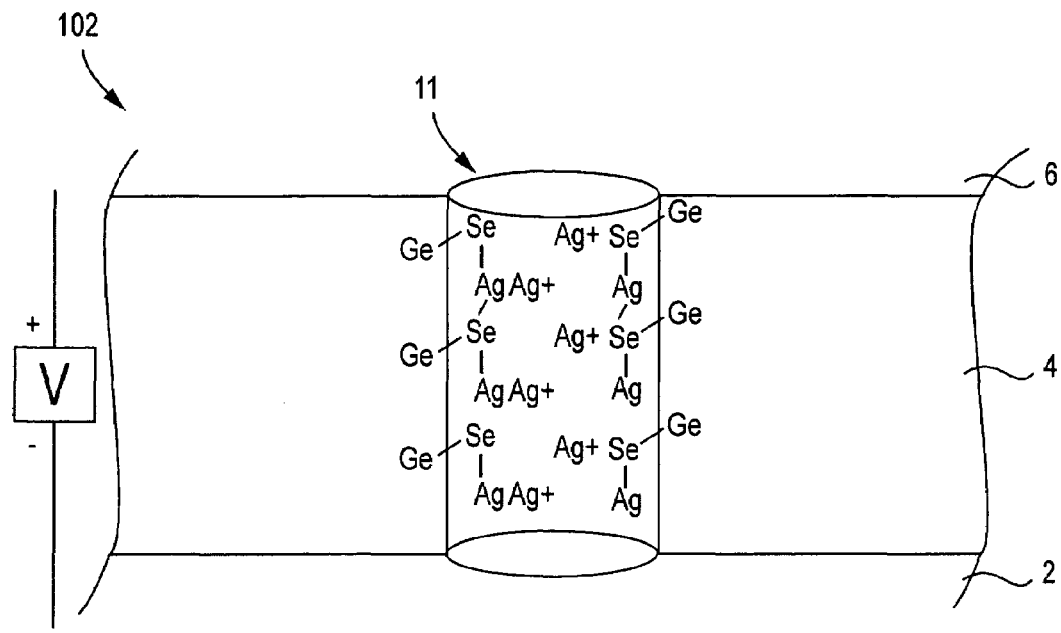
Figure 3D:
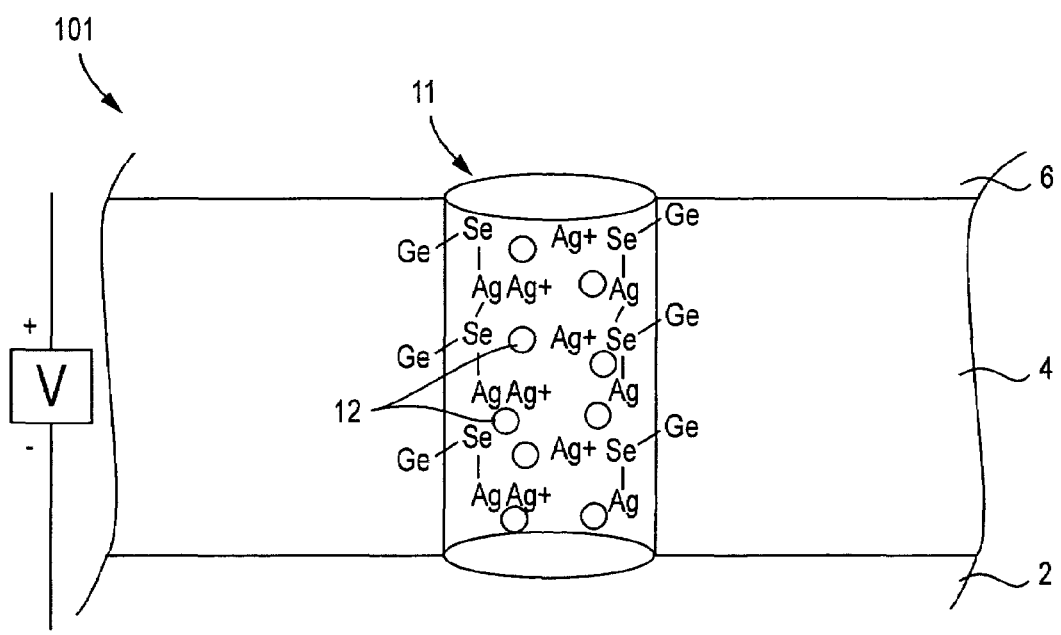
Figure 3E:
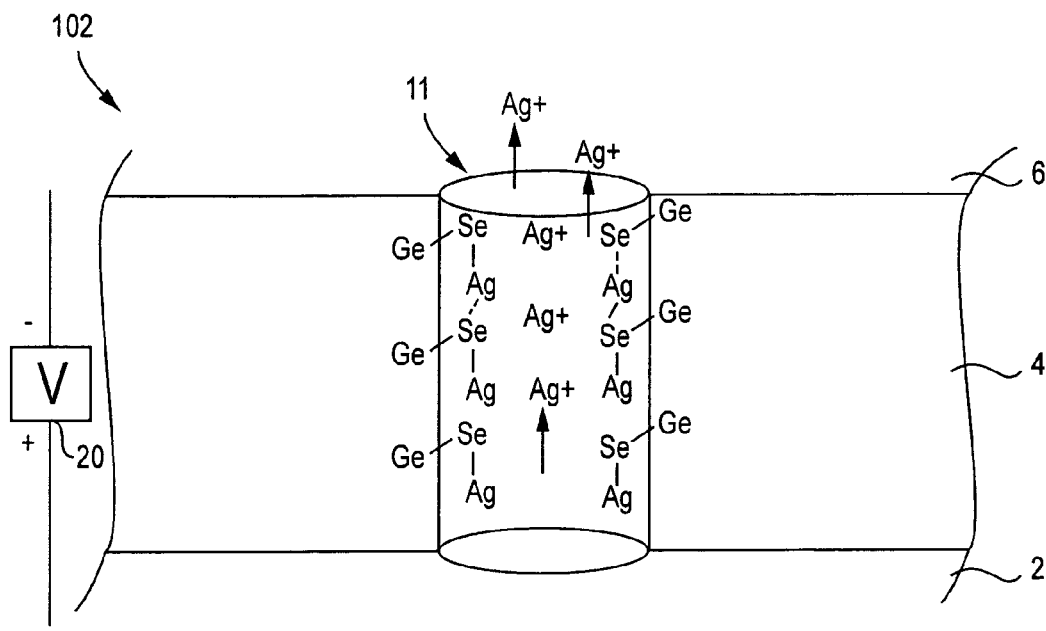
Figure 3F:
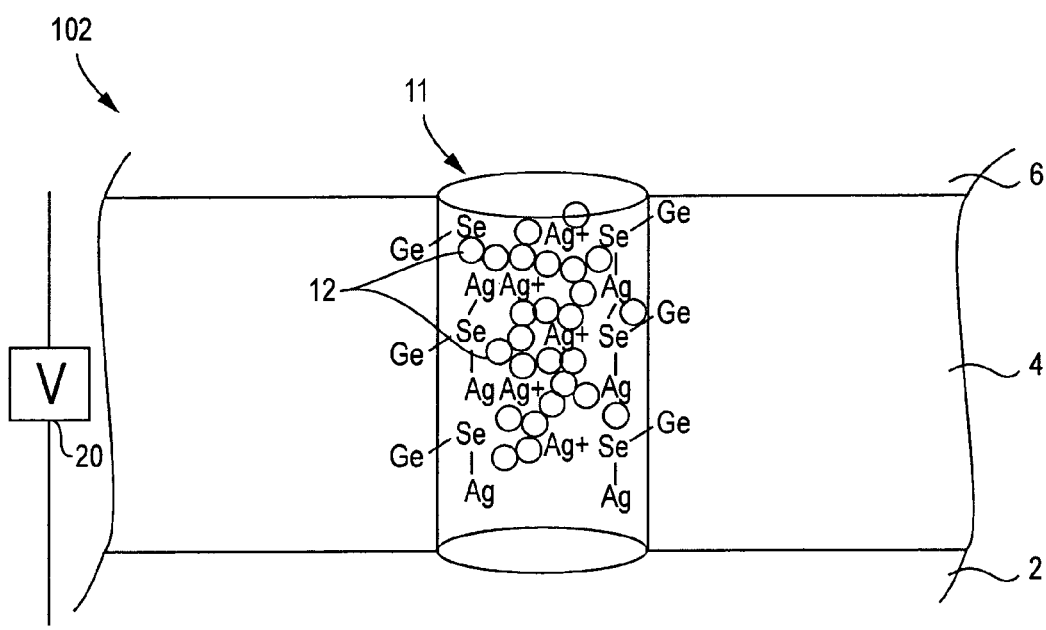

Referring to FIG. 3C, when a conditioning pulse $V_1$ is applied across memory element 102, excess Ag ions from the first and/or second metal-containing layers 6, 7 and/or from electrode 10 (if ions are available), enter into glass layer 4 and break some of the Ge—Ge bonds 17. This forms conducting channel 11 via incorporation of $Ag_2Se$ from the first metal-containing layer 6 and is illustrated in FIG. 3C. The conditioning pulse's $V_1$ parameters are dependent upon composition and thickness of the layers comprising memory element 102. Moreover, the methods of operating memory element 101 depicted in FIGS. 2C–2F, is similar to the methods of operating memory element 102 for write, read and erase operations. Thus, as described above with reference to FIGS. 2C–2F, the methods of operating memory element 102 can proceed in a similar manner as illustrated in FIGS. 3C–3F.

Figure 4A:
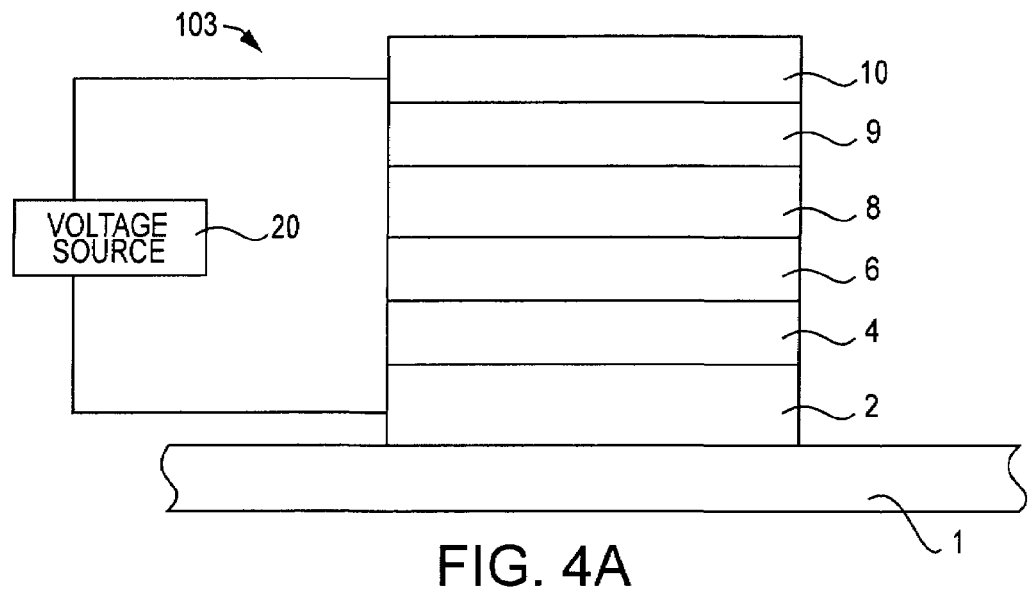
FIGS. 4A–4F illustrates a cross-sectional view of a resistance variable memory device fabricated in accordance with a fourth embodiment of the invention.

FIG. 4A depicts a fourth exemplary embodiment of a resistance variable memory device 103 constructed in accordance with the invention.

A first electrode 2 is formed over a substrate 1. The first electrode 2 may comprise any of the conductive materials listed above for the electrode 2 described in the FIGS. 1A, 2A and 3A embodiments. Next, a first glass layer 4 is formed over the first electrode 2. The first glass layer 4 is electrically coupled to electrode 2. The first glass layer 4 can comprise the same material as provided for the glass layer 4 in FIGS. 2A and 3A.

For purposes of a simplified description, the first glass layer 4 is described further below as a $Ge_{40}Se_{60}$ chalcogenide glass layer 4. The formation of the first chalcogenide glass layer 4 can be accomplished by any of the methods described above for forming the glass layer 4 of FIGS. 2A and 3A. The first glass layer 4 may comprise one or more layers of a glass material. The first glass layer 4 is formed to a thickness of from about 150 Å to about 500 Å thick, and preferably is about 150 Å thick.

Still referring to FIG. 4A, a first metal-containing layer 6, preferably silver-selenide, is formed over the first chalcogenide glass layer 4. The formation of the first metal-containing layer 6 can be accomplished by any of the methods described above for forming the metal-containing layer 6 of FIGS. 2A and 3A. The first metal-containing layer 6 may comprise one or more layers of a metal-containing material. The first metal-containing layer 6 is formed to a thickness of from about 300 Å to about 1200 Å thick, and preferably is about 470 Å thick.

Next, a second glass layer 8 is formed over the first metal-containing layer 6. The second glass layer 8 may be used as a diffusion control layer to control the migration of metal ions into the glass layer 4. The formation and composition of the second glass layer 8 is the same as described above for the formation and composition of the glass layer 4 of FIGS. 2A and 3A. For purposes of a simplified description, the second glass layer 8 is described as a chalcogenide glass layer having a stoichiometry similar to the first glass layer 4 e.g., $Ge_{40}Se_{60}$. Further, one or more layers of glass material can be provided if desired.

Although the first glass layer 4 and the second glass layer 8 are described above as having a stoichiometry and material composition similar to each other, e.g., $Ge_{40}Se_{60}$, it should be appreciated that the first glass layer 4 and the second glass layer 8 can possess different stoichiometries from each other, be different thicknesses, and they can even be different glasses. The second glass layer 8 may be formed to a thickness of from about 100 Å to about 300 Å thick and preferably is about 150 Å thick.

Next, a second metal-containing layer 9, preferably silver, is formed over the second glass layer 8. The formation of the second metal-containing layer 9 can be accomplished by any of the methods described above for forming the metal-containing layer 6 of FIGS. 2A and 3A. The second metal-containing layer 9 may comprise one or more layers of a metal-containing material. The second metal-containing layer 9 is formed to a thickness of from about 100 Å to about 500 Å thick, and preferably is about 200 Å thick.

It should be appreciated that excess metal ions need to be provided either by the first metal-containing layer 6 or second metal-containing layer 9, and/or second electrode 10. For instance, the first metal-containing layer 6 can be formed containing excess metal ions. Alternatively, if the excess metal ions are not part of the first metal-containing layer 6 i.e., added specifically or deposited with an excess metal, the additional metal ions can be provided from the second metal-containing layer 9 and/or second electrode 10. The second metal-containing layer 9 should have a sufficient thickness that gives the desired excess amount of metal ions to the first metal-containing layer 6. In an alternate embodiment, a third metal-containing layer 7 can be provided, if desired. Preferably, the third metal-containing layer comprises silver.

The second metal-containing layer 9 can comprise any metal ions so long as it provides metal ions to the conducting channel 11 formed in the chalcogenide glass layer 4 after application of a conditioning voltage across the electrodes 2 and 10.

In an exemplary embodiment, the presence of the third metal-containing layer 7 serves as the source and receptacle for metal ions. For example, during a 'write' process, the third metal-containing layer 7 is the source of the metal ions that move into the conducting channel 11. During an 'erase' process, the third metal-containing layer 7 is the receptacle of the metal ions that move out of the conducting channel 11.

A second electrode 10 is next formed over the third metal-containing layer 7, as illustrated in FIG. 4A, to complete the formation of the memory device 103. The second electrode 10 may comprise any of the conductive materials listed above for the electrode 10 as described above in the FIGS. 2A and 3A embodiments. FIG. 4A illustrates that the second electrode 10 is in contact with an upper surface of the third metal-containing layer 7; however, intervening layers may be provided between layers 7 and 10, if desired. As described above, the third metal-containing layer 7 can provide additional Ag ions. In addition, the second electrode 10 can comprise Ag which can also provide additional Ag ions if the third metal-containing layer 7 is omitted from memory element 103.

In another exemplary embodiment, the third metal containing layer 7 is omitted and the second metal-containing layer 9, can provide and receive metal ions, e.g., Ag ions, and can be the source and receptacle of metal ions during a write and erase operation. It is also possible to use an electrode 10, which donates or receives metal ions with the third metal-containing layer 7 or second metal-containing layer 9, which also donates or receives metal ions in combination.

It should be appreciated that the first electrode 2 and the second electrode 10 can comprise the same or different materials. However, for example, if the first electrode 2 and the second electrode 10 comprise the same material such as tungsten or any other non-metal ion comprising metal, one side of the memory element 103, preferably the side with the second electrode 10, must have an excess of metal ions, e.g., Ag.

As described above, the third metal-containing layer 7 can provide Ag ions or the second metal-containing layer 9 can. In addition, the second electrode 10 can comprise Ag, if used, which can also provide Ag ions if the third metal-containing layer 7 is omitted from memory element 103, if desirable. Because the metal ions, e.g., Ag ions which enter and leave glass 4 is coming from the third metal-containing layer 7, if provided, or layer 10, or layer 9, if layer 7 is not provided, it is preferable that electrode 2 not donate any metal ions As a result, although intervening barrier layers are not illustrated in the FIG. 4A embodiment, intervening barrier layers can be present to prevent metal ion migration from electrode 2 into glass layer 4, or from electrode 10 into glass layer 4. Barrier layers, if provided, should not contain mobile metal ions.

A method of operating and manipulating the resistance state of the memory element depicted in FIG. 4A is described below in reference to FIGS. 4B–4F. For exemplary purposes, the methods of operation described in FIGS. 4B–4F is for a memory element 103 comprising a first $Ge_{40}Se_{60}$ glass layer 4 that is 150 Å thick, a first $Ag_2Se$ layer 470 Å thick, a second $Ge_{40}Se_{60}$ glass layer 8 that is 150 Å, a second $Ag_2Se$ layer 200 Å thick, and a silver layer 300 Å thick.

Figure 4B:
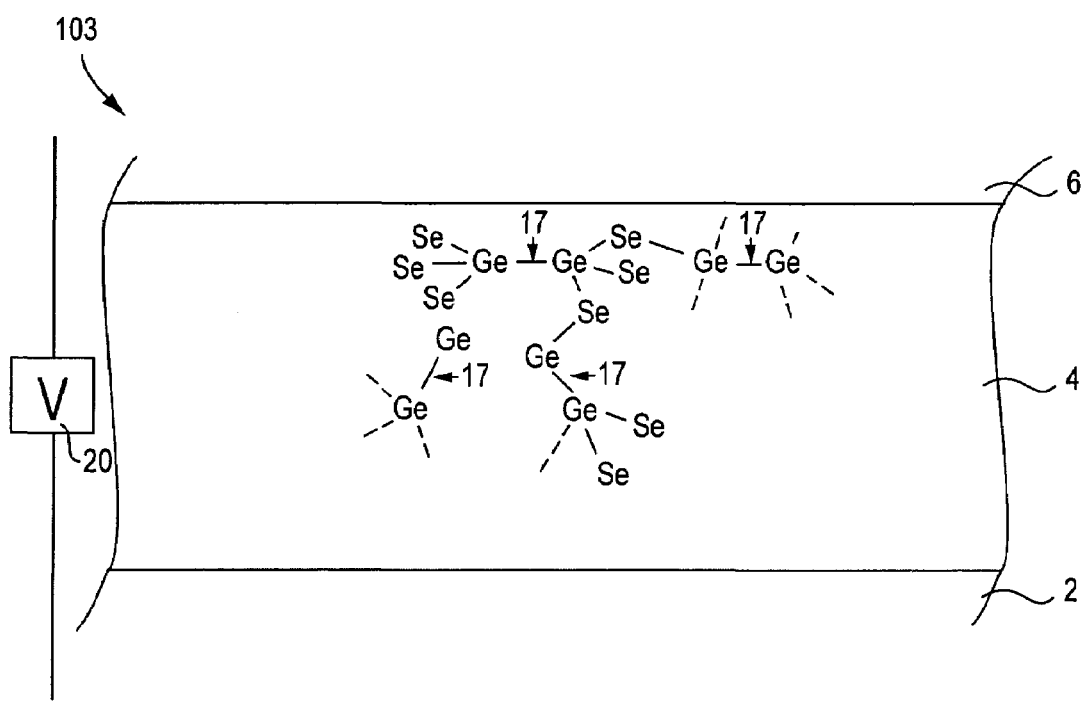

Reference is now made to FIG. 4B which is a cross-sectional view of the memory element 103 of FIG. 4A prior to application of a conditioning pulse. As FIG. 4B illustrates, the $Ge_{40}Se_{60}$ glass layer 4 has no long range order. FIG. 4B further illustrates the presence of germanium-germanium (Ge—Ge) bonds 17 throughout the glass layer 4. The presence of another species which can provide a more thermodynamically favorable energy than the Ge—Ge bond energy will break the Ge—Ge bonds 17 and bond with the previously bonded Ge. Accordingly, the Ge—Ge bonds 17 are not strong and can easily be broken.

Figure 4C:
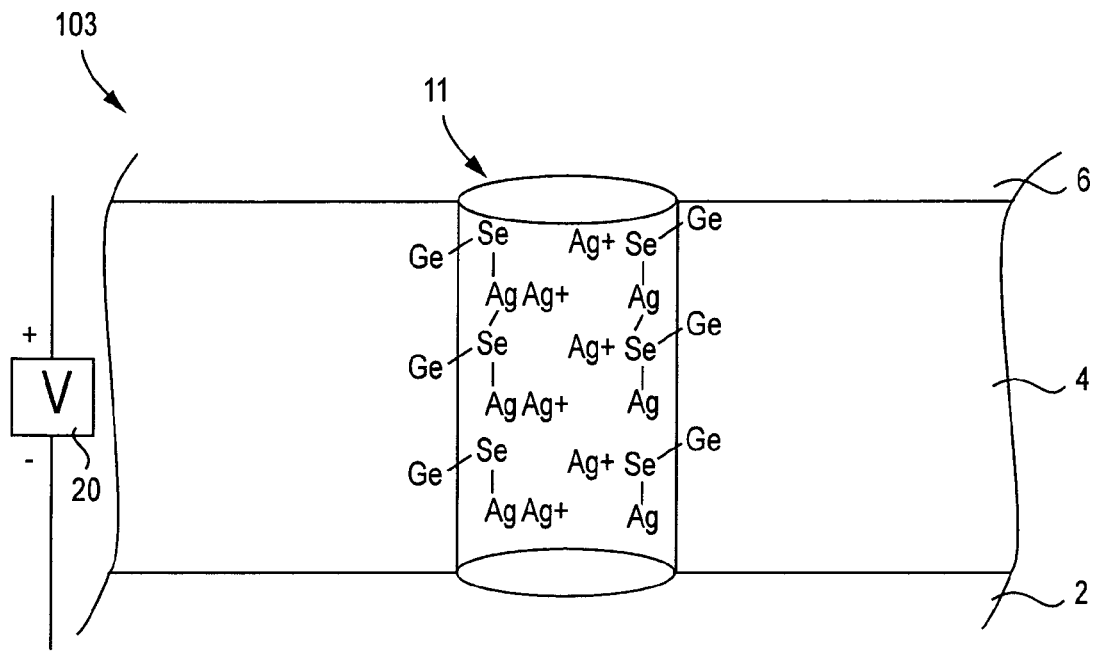
Figure 4D:
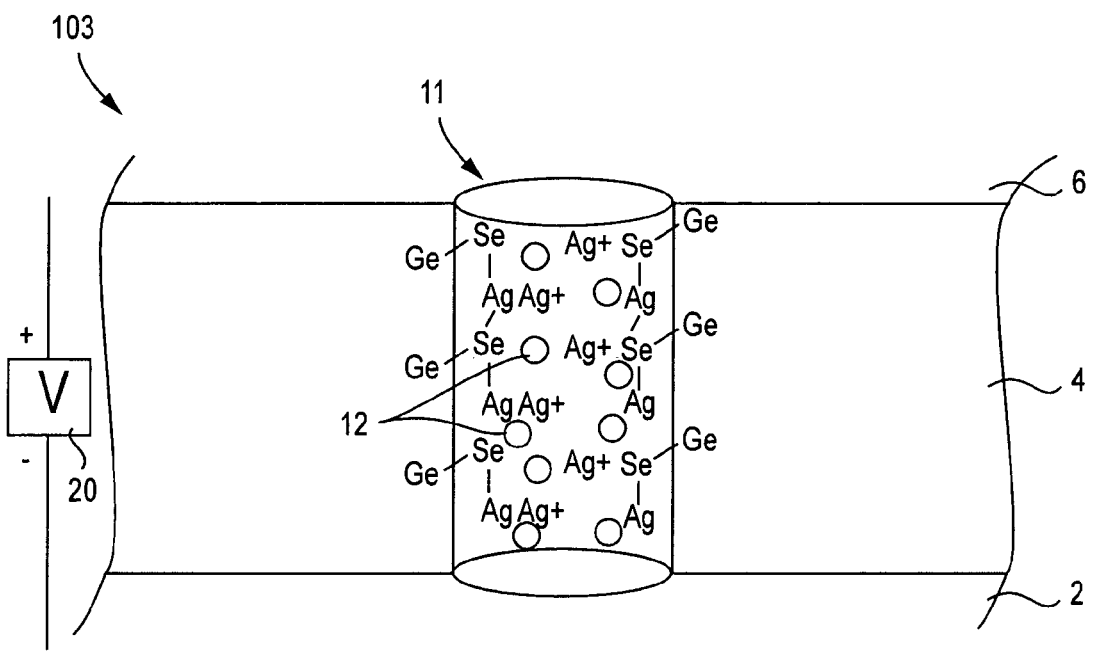
Figure 4E:
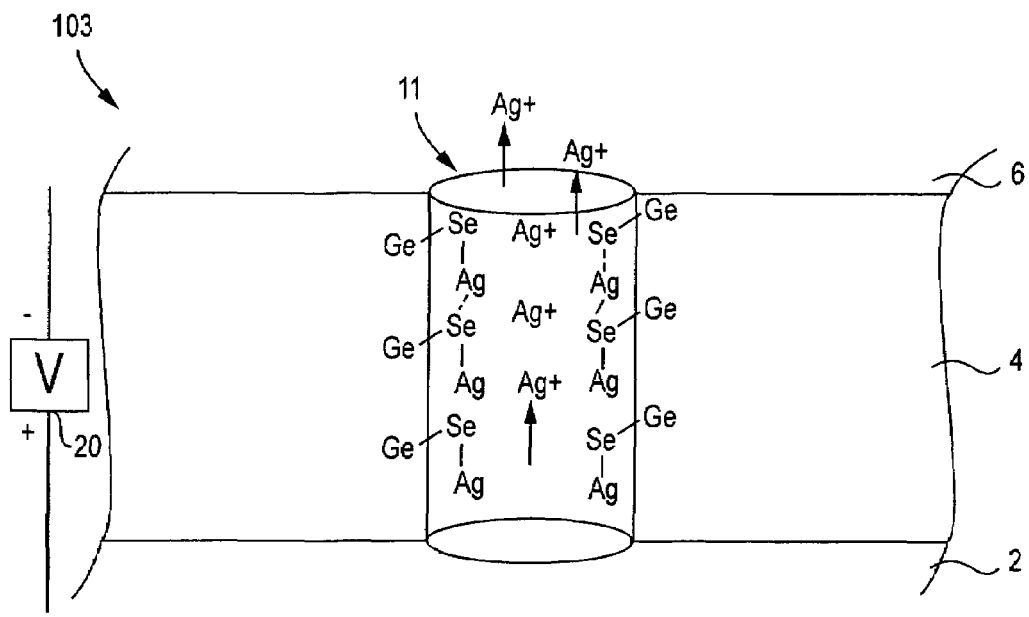
Figure 4F:
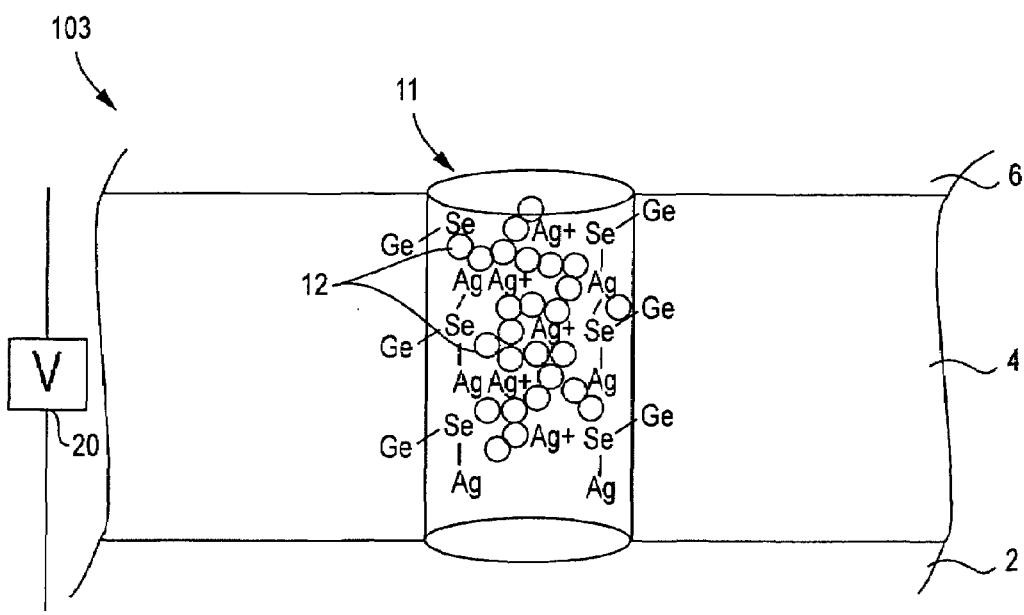
Figure 5:
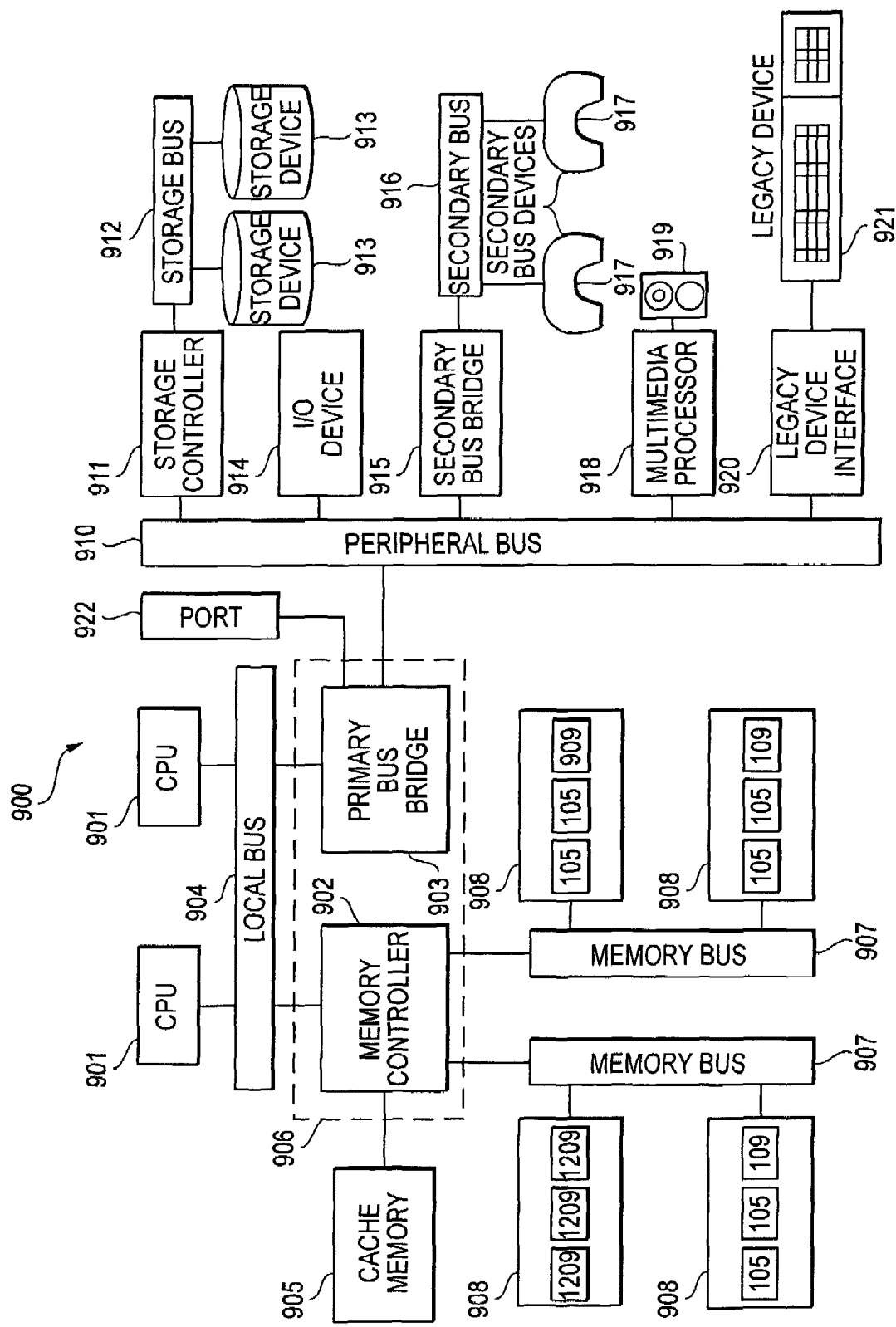
FIG. 5 illustrates a processor-based system having one or more memory devices that contains resistance variable memory elements according to the various embodiments of the invention.

Referring now to FIG. 4C, a conditioning pulse VI is applied to memory element 103. Memory element 103 is conditioned in a similar manner as described above with regard to memory elements 101 and 102. Conditioning the memory element 103, is done only once and after the memory element 103 is conditioned, the conditioned memory element 103 will operate through normal write and erase operations.

Accordingly, applying a conditioning pulse from the voltage source 20 forms a conducting channel 11 via incorporation of $Ag_2Se$ from the metal-containing layer 6 into the glass backbone which is illustrated in FIG. 4C. The $Ag_2Se$ becomes polarized and aligned within the glass 4 backbone to form conductive channel 11. The conditioning pulse's parameters are dependent upon the thickness of the layers comprising memory element 103. Moreover, similar to the methods of operating memory elements 101 and 102 depicted in FIGS. 2C–2F and 3C–3F, the method of operating memory element 103 depicted in FIGS. 4C–4F, proceeds in an analogous manner as described above with reference to FIGS. 2C–2F and 3C–3F.

It should be further appreciated that with regard to memory elements 101, 102 and 103, the presence of an additional metal-containing layer 7, which provides the Ag ions, can enhance the switching characteristics of the memory elements 101, 102 and 103. For instance, since there are more available Ag ions to move in and out of the pre-formed conducting channels 11, the memory elements 101, 102 and 103 can operate with greater speed.

Although the embodiments described above in FIGS. 1A–4F, refer to the formation of only one resistance variable memory element 100, 101, 102 and 103, it must be understood that the invention contemplates the formation of any number of such memory elements. A plurality of resistance variable memory elements can be fabricated in a memory array and operated with memory access circuits. Thus, the resistance variable memory elements 100, 101, 102 and 103 can be utilized in many electronic devices. Specifically, the methods and operation of the memory elements disclosed herein, can be used in any device whenever it is desired to have a resistance variable memory element with faster switching times.

The resistance variable memory elements 100, 101, 102 and 103 of the invention may be used in memory applications as well as in creating various CMOS type circuits.

The invention is not limited to the details of the illustrated embodiments. Accordingly, the above description and drawings are only to be considered illustrative of exemplary embodiments which achieve the features and advantages of the invention. Modifications and substitutions to specific methods, process conditions, and structures can be made without departing from the spirit and scope of the invention. Accordingly, the invention is not to be considered as being limited by the foregoing description and drawings, but is only limited by the scope of the appended claims.

What is claimed as new and desired to be protected by letters Patent of United States is:

1. A method of forming a memory element, said method comprising:
   forming a first electrode;
   forming a first resistance variable material layer in contact with the first electrode;
   forming a first metal-containing layer adjacent said resistance variable material;
   forming a metal layer in contact with the first metal-containing layer;
   forming a second electrode in contact with the metal layer; and
   forming at least one conducting channel within said resistance variable material layer by applying a conditioning voltage to the memory element.

2. The method of claim 1, wherein said resistance variable material layer is a chalcogenide glass layer.

3. The method of claim 2, wherein said chalcogenide glass layer has a stoichiometry of $Ge_xSe_{100-x}$.

4. The method of claim 3, wherein said chalcogenide glass layer has a stoichiometry from about $Ge_{18}Se_{82}$ to $Ge_{25}Se_{75}$.

5. The method of claim 4, wherein said chalcogenide glass layer is doped with metal ions.

6. The method of claim 5, wherein said metal ions are silver ions.

7. The method of claim 6, wherein said doped chalcogenide glass layer is from about 150 Å to about 600 Å thick.

8. The method of claim 7, wherein said doped chalcogenide glass layer has polarizable metal-chalcogen regions.

9. The method of claim 8, wherein said polarizable metal-chalcogen regions are $Ag_2Se$ regions within a germanium-selenide glass backbone.

10. The method of claim 9, wherein said $Ag_2Se$ regions become aligned upon application of said conditioning voltage to said memory element.

11. The method of claim 10, wherein said conditioning voltage is greater than subsequent write, read, and erase voltages.

12. The method of claim 10, wherein the $Ag_2Se$ regions form at least one conducting channel by becoming polarized and aligning within the doped chalcogenide glass layer.

13. The method of claim 1, wherein prior to applying said conditioning voltage, said memory element has a first resistance state and after applying said conditioning voltage to said memory element, said memory element has a second resistance state lower than said first resistance state.

14. The method of claim 13, wherein subsequent write, read, and erase voltages have an absolute magnitude lower than that of said conditioning voltage.

15. The method of claim 14, wherein applying a write voltage produces a third resistance state lower than the second resistance state.

16. The method of claim 15, wherein applying a second write voltage produces a fourth resistance state lower than said third resistance state.

17. The method of claim 1, wherein said chalcogenide glass layer has a stoichiometry from about $Ge_{20}Se_{80}$ to $Ge_{43}Se_{57}$.

18. The method of claim 17, wherein said chalcogenide glass layer has a stoichiometry of $Ge_{40}Se_{60}$.

19. The method of claim 17, wherein said chalcogenide glass layer is from about 150 Å to about 500 Å thick.

20. The method of claim 1, wherein said a first metal-containing layer is from about 300 Å to about 1200 Å thick.

21. The method of claim 20, wherein said a first metal-containing layer is an $Ag_2Se$ layer.

22. The method of claim 21, wherein the conditioning voltage is applied to the memory element driving $Ag_2Se$ into the chalcogenide glass layer.

23. The method of claim 22, wherein the chalcogenide glass layer has a germanium-selenide glass backbone.

24. The method of claim 23, wherein the $Ag_2Se$ bonds to the germanium-selenide glass backbone forming at least one conducting channel within said chalcogenide glass layer.

25. The method of claim 20, further comprising forming a second metal-containing layer over the first metal-containing layer.

26. The method of claim 25, wherein said second metal-containing layer comprises silver ions.

27. The method of claim 26, wherein said silver ions are driven into and out of the at least one conducting channel by applying different voltages.

28. The method of claim 1, wherein said conditioning voltage has a pulse duration of from about 10 to about 500 ns and is approximately 700 mV or greater.

29. A method of forming a memory element, said method comprising:
    forming a first chalcogenide glass layer;
    forming a first metal-containing layer over said chalcogenide glass layer;
    forming a second chalcogenide glass layer over the first metal-containing layer;
    forming a second metal-containing layer over the first chalcogenide glass layer;
    electrically coupling first and second electrodes to said first and second chalcogenide glass layers, wherein the second electrode is formed in contact with said second metal-containing layer; and
    applying a conditioning pulse to the memory element to bond regions of metal and glass within at least one of said first and second chalcogenide glass layers, said bonded regions forming at least one conducting channel within said at least one of said first and second chalcogenide glass layers.

30. The method of claim 29, wherein said first chalcogenide glass layer has a stoichiometry that is from about $Ge_{20}Se_{80}$ to about $Ge_{43}Se_{57}$.

31. The method of claim 30, wherein said first chalcogenide glass layer has a stoichiometry that is $Ge_{40}Se_{60}$.

32. The method of claim 30, wherein said first chalcogenide glass layer is from about 150 Å to about 500 Å thick.

33. The method of claim 32, wherein said first chalcogenide glass has a germanium-selenide glass backbone.

34. The method of claim 33, wherein the bonded regions of metal is $Ag_2Se$ bonded to germanium-selenide.

35. The method of claim 29, wherein said first metal-containing layer is from about 300 Å to about 1200 Å thick.

36. The method of claim 35, wherein said first metal-containing layer is an $Ag_2Se$ layer.

37. The method of claim 29, wherein the memory element has a first resistance state.

38. The method of claim 37, wherein applying a write voltage moves said memory element from said first resistance state to a second resistance state, said second resistance state being lower than said first resistance state.

39. The memory element of claim 38, wherein applying a second write voltage to said memory element moves said memory element from said second resistance state to a third resistance state, said third resistance state being lower than said second resistance state.

40. The method of claim 29, wherein said second metal-containing layer comprises silver ions.

41. The method of claim 40, wherein said silver ions are driven into and out of the at least one conducting channel by applying a write, erase or read voltage.

42. The method of claim 29, wherein said second chalcogenide glass layer is from about 100 Å to about 300 Å thick.

43. A method of forming a memory element, said method comprising:
    forming a first chalcogenide glass layer;
    forming a first metal-containing layer over said chalcogenide glass layer;
    forming a second chalcogenide glass layer over the first metal-containing layer;
    forming a second metal-containing layer over the second chalcogenide glass layer, wherein said second metal-containing layer is from about 100 Å to about 500 Å thick;
    electrically coupling first and second electrodes to said first chalcogenide glass layer; and
    applying a conditioning pulse to the memory element to bond regions of metal and glass within said first chalcogenide glass layer, said bonded regions forming at least one conducting channel within said first chalcogenide glass layer.

44. The method of claim 43, further comprising forming a third metal-containing layer over said second metal-containing layer.

45. The method of claim 44, wherein said third metal-containing layer comprises silver ions.

46. The method of claim 45, wherein said silver ions are driven into and out of the at least one conducting channel by applying a write, erase, or read voltage.

* * * * *